(12) United States Patent
Kudose et al.

(10) Patent No.: US 8,390,104 B2
(45) Date of Patent: Mar. 5, 2013

(54) SEMICONDUCTOR APPARATUS PACKAGING STRUCTURE HAVING EMBOSSED TAPE OVER TAB TAPE, THE EMBOSSED TAPE AND METHOD OF FORMING THE SEMICONDUCTOR APPARATUS PACKAGING STRUCTURE

(75) Inventors: Satoru Kudose, Osaka (JP); Kenji Toyosawa, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 169 days.

(21) Appl. No.: 12/734,510

(22) PCT Filed: Nov. 7, 2008

(86) PCT No.: PCT/JP2008/070335
§ 371 (c)(1),
(2), (4) Date: May 6, 2010

(87) PCT Pub. No.: WO2009/060949
PCT Pub. Date: May 14, 2009

(65) Prior Publication Data
US 2010/0230793 A1    Sep. 16, 2010

(30) Foreign Application Priority Data

Nov. 9, 2007   (JP) ................... 2007-292614
Nov. 6, 2008   (JP) ................... 2008-285554

(51) Int. Cl.
*H01L 23/495*   (2006.01)
*H01L 23/02*    (2006.01)
*H01L 21/00*    (2006.01)
*B65D 85/00*    (2006.01)

(52) U.S. Cl. ........ 257/676; 257/678; 438/123; 206/701; 206/714; 206/715; 206/716; 206/717; 206/718; 206/719; 206/720; 206/721; 206/722; 206/723; 206/724; 206/725; 206/726; 206/727; 206/728

(58) Field of Classification Search ................. None
See application file for complete search history.

(56) References Cited

U.S. PATENT DOCUMENTS 5,491,013 A * 2/1996 Holley .................. 428/40.5
5,846,621 A * 12/1998 Nagamatsu ............ 428/40.1
(Continued)

FOREIGN PATENT DOCUMENTS

| CN | 1574342   | 2/2005  |
|----|-----------|---------|
| JP | 5-326646  | 12/1993 |
| JP | 6-080177  | 3/1994  |
| JP | 10-144724 | 5/1998  |

(Continued)

OTHER PUBLICATIONS

Machine translation of JP 2003-197689 to Yazawa, K.*

*Primary Examiner* — N Drew Richards
*Assistant Examiner* — Michael Jung
(74) *Attorney, Agent, or Firm* — Harness, Dickey & Pierce, P.L.C.

(57) ABSTRACT

A TAB tape (100) packaging structure in which (i) the TAB tape (100) including a plurality of semiconductor chips (103) which are fixed, on a film (101) on which wiring patterns are repeatedly provided and (ii) an embossed tape (200) which is electroconductive and has embossed parts (202) which are sequentially provided on a first surface of and in a longitudinal direction of a film (201) are wound on a reel which is electroconductive is arranged such that the TAB tape (100) and the embossed tape (200) are wound on the reel, while (i) a first surface of the film (101) on which surface the plurality of semiconductor chips (103) are fixed and (ii) the first surface of the film (201) on which surface the embossed parts (202) protrude are overlapping and facing each other, and the embossed tape (200) has a total thickness of not less than (t+0.4) mm and not more than 1.1 mm in a case where each of the plurality of semiconductor chips (103) has a thickness of t ($0.2 \leq t \leq 0.625$) mm and the film (201) has a substantial thickness of 0.125 mm. This realizes packaging of a TAB tape in a desired winding length while sufficiently securing protection of the TAB tape during shipping and transportation.

9 Claims, 14 Drawing Sheets

U.S. PATENT DOCUMENTS

| | | | |
|---|---|---|---|
| 5,875,897 A * | 3/1999 | Duncan et al. | 206/714 |
| 6,857,493 B2 * | 2/2005 | Shupp et al. | 180/168 |
| 6,875,493 B2 * | 4/2005 | White, Jr. | 428/71 |
| 6,919,513 B2 * | 7/2005 | Chung et al. | 174/255 |
| 2004/0242803 A1 * | 12/2004 | Ohme et al. | 525/400 |
| 2004/0256702 A1 | 12/2004 | Iwane et al. | |
| 2006/0011770 A1 * | 1/2006 | Narabayashi | 242/538.2 |

FOREIGN PATENT DOCUMENTS

| | | | |
|---|---|---|---|
| JP | 2003-197689 | * | 7/2003 |
| JP | 2004-327550 | | 11/2004 |
| JP | 2005-022701 | | 1/2005 |
| JP | 2005-225552 | | 8/2005 |
| JP | 2006-310476 | | 11/2006 |
| JP | 2007-158264 | | 6/2007 |

* cited by examiner

FIG. 17

| | Embossed Tape Total Thickness h | Product Length By Lead Tape Length | | |
|---|---|---|---|---|
| | | 8m | 6m | 4m |
| Double-Sided Embossed | 2.275 | 36 | 38 | 40 |
| Single-Sided Embossed | 1.3 | 66 | 68 | 70 |
| | 1.2 | 73 | 75 | 77 |
| | 1.1 | 80 | 82 | 84 |
| | 1.05 | 84 | 86 | 88 |
| | 1 | 84 | 86 | 88 |
| | 0.9 | 98 | 100 | 102 |
| | 0.8 | 111 | 113 | 115 |
| | 0.75 | 119 | 121 | 123 |

Unit: mm

FIG. 18

| | Embossed Tape Total Thickness h | Product Length By Lead Tape Length | | |
|---|---|---|---|---|
| | | 8m | 6m | 4m |
| Double-Sided Embossed | 2.275 | 37 | 39 | 41 |
| Single-Sided Embossed | 1.3 | 69 | 71 | 73 |
| | 1.2 | 75 | 77 | 79 |
| | 1.1 | 82 | 84 | 86 |
| | 1.05 | 86 | 88 | 90 |
| | 1 | 86 | 88 | 90 |
| | 0.9 | 102 | 104 | 106 |
| | 0.8 | 114 | 116 | 118 |
| | 0.75 | 122 | 124 | 126 |

Unit: mm

| Embossed Tape | | Chip Thickness | | |
|---|---|---|---|---|
| Total Thickness | Real Height | 0.400 | 0.625 | 0.725 |
| 0.80 | 0.675 | 0.263 | 0.038 | −0.062 |
| 0.90 | 0.775 | 0.363 | 0.138 | 0.038 |
| 1.00 | 0.875 | 0.463 | 0.238 | 0.138 |
| 1.10 | 0.975 | 0.563 | 0.338 | 0.238 |
| 1.20 | 1.075 | 0.663 | 0.438 | 0.338 |

Unit: mm

SEMICONDUCTOR APPARATUS PACKAGING STRUCTURE HAVING EMBOSSED TAPE OVER TAB TAPE, THE EMBOSSED TAPE AND METHOD OF FORMING THE SEMICONDUCTOR APPARATUS PACKAGING STRUCTURE

TECHNICAL FIELD

The present invention relates to a semiconductor apparatus packaging structure, and a semiconductor apparatus packaging method, each of which allows a semiconductor apparatus mounted on a tape to be shipped and transported in a state where the semiconductor apparatus, together with the embossed tape, has been wound on a reel, and to an embossed tape for use in packaging the semiconductor apparatus.

BACKGROUND ART

Drivers ICs or drivers LSI for a liquid crystal display are mounted in a structure of TCP (Tape Carrier Package) or COF (Chip on Film). Such a structure is referred to as a TAB (Tape Automated Bonding) tape. A film mounting IC or LSI is used as a semiconductor chip mounted on the TAP tape.

According to such a TAB tape, a circuit is provided on a tape-like film on which the semiconductor chips are mounted and wiring patterns are provided. The TAB tape is therefore entirely thin and can be bent freely to some extent in any place. Therefore, the TAB tape is contributory in making the liquid crystal display smaller and thinner. Against a backdrop of this, in order to win a recent price competition for a television set in which the liquid crystal display is mounted, the TAB tape is required to be produced at higher productivity. In order to achieve such higher productivity, for example, the TAB tape is required to be longer.

Conventionally, in view of workability and easiness of storage and transportation, the TAB tape which has been subjected to the mounting of the semiconductor chips is packaged while being wound on a reel and is then shipped and transported. In this case, the TAB tape has been wound concurrently with a tape on which protruding parts serving as cushioning are provided (this tape is referred to as a so-called spacer tape or an embossed tape). This is intended to (i) protect a surface of the TAB tape wound on the reel on which surface the circuit is provided and (ii) mechanically protect the semiconductor chips from an external force.

FIG. 23 is a cross-sectional view illustrating a state where a TAB tape 550 has been wound on a reel by use of a conventional spacer tape 500.

According to the conventional spacer tape 500 embossed parts 502 are provided on one surface of a tape 501 and embossed parts 503 are provided on the other surface of the tape 501. The embossed parts 502 and the embossed parts 503 are alternately provided at regular intervals at opposite ends of the tape 501. The embossed parts 502 and the embossed parts 503 have a substantially identical height, which has been sufficiently secured so that a surface of the TAB tape 550 on which surface a circuit is provided is protected.

However, a length of the TAB tape 550 for which length the TAB tape 550 can be wound on one (1) reel depends on a total thickness of the spacer tape 500 which total thickness includes the heights of the embossed parts 502 and the embossed parts 503. As the spacer tape 500 has a larger total thickness, a winding outline becomes larger even in a case where the TAB tape 550 which has an identical length is wound on the reel. In view of this, it is necessary to replace the reel with a larger reel.

However, a reel for shipping and transportation has a substantially standardized size. A small-sized reel has a size of Φ 405 mm and a next-larger reel has a size of Φ 530 mm. In view of this, an increase in size of the reel from Φ 405 mm to Φ 530 mm or merely a longer TAB tape causes the reel to be larger. This causes an increase in capital investment in replacing the small-sized reel with the next-larger reel which is expensive and improving in structural strength. Further, a larger reel causes problems of (i) an increase in necessary storage space, (ii) a decrease in productivity per floor area, and (iii) an increase in transportation cost. Hence, the larger reel causes no improvement in productivity due to these problems. It is therefore difficult in the conventional spacer tape 500 to cause the TAB tape 550 to be longer.

In contrast, Patent Literatures 1 and 2 disclose spacer tapes in each of which a TAB tape is larger.

FIG. 24 is a cross-sectional view illustrating a state where a TAB tape 550 has been wound on a reel by use of a spacer tape 600 disclosed in Patent Literature 1.

According to the spacer tape 600, protruding parts 602 are provided on one surface of a tape 601 and protruding parts 603 are provided on the other surface of the tape 601. The protruding parts 602 and the protruding parts 603 are alternately provided at regular intervals at opposite ends of the tape 601. The protruding parts 603 have a lower height than the protruding parts 602. This prevents damage to both the first and second surfaces of the TAB tape 550 and causes an increase in amount of winding of the TAB tape 550.

FIG. 25 is a cross-sectional view illustrating a state where a TAB tape 750 has been wound on a reel by use of a spacer tape 700 disclosed in Patent Literature 2.

The spacer tape 700 has protruding parts 702 provided only on a single surface of a tape 701. The protruding parts 702 are provided at regular intervals at opposite ends of the tape 701. The spacer tape 700 is effectively used in a case where it is only necessary to protect only a single surface of the TAB tape 750 on which semiconductor chips have not yet been mounted. According to the spacer tape 700, the protruding parts 702 are provided only on its single surface. This causes an increase in amount of winding of the TAB tape 750.

Patent Literature 1

Japanese Patent Application Publication, Tokukai, No. 2004-327550 A (Publication Date: Nov. 18, 2004)

Patent Literature 2

Japanese Patent Application Publication, Tokukaihei, No. 6-80177 A (Publication Date: Mar. 22, 1994)

Patent Literature 3

Japanese Patent Application Publication, Tokukai, No. 2006-310476 A (Publication Date: Nov. 9, 2006)

SUMMARY OF INVENTION

However, there is a problem that it is impossible for the spacer tape 600 (see Patent Literature 1) and the spacer tape 700 (see Patent Literature 2) to achieve winding of a TAB tape in a recently-demanded length while sufficiently securing protection of the TAB tape during shipping and transportation.

Namely, it has been recently demanded that a TAB tape of approximately 80 m be wound by use of a small-sized reel which has a size of Φ 405 mm. It has been conventionally considered as general that the TAB tape of approximately 40 m is wound by use of the small-sized reel which has a size of Φ 405 mm. Only the TAB tape of approximately 60 m can be wound even by use of the spacer tape 600 (see Patent Literature 1).

Note that the spacer tape 700 (see Patent Literature 2) is intended for use in the TAB tape 750 on which semiconductor chips have not yet been mounted. In view of this, measures are insufficiently taken to protect, during shipping and transportation, a TAB tape on which the semiconductor chips are mounted. A vibration is caused during shipping and transportation, and it is therefore necessary to cause the protruding parts 702 to have a sufficient height so as to prevent damage to at least the semiconductor chips. As far as a protruding part which has a low height is concerned, Patent Literature 3 discloses a laminate spacer tape for use in (i) a circuit production process and (ii) a circuit tape on which semiconductor chips are mounted and protruding parts which have a low height are provided. This laminate spacer tape is intended for use from a state of a raw tape on which a circuit has not yet been configured. This allows the protruding parts to have a low height.

However, for example, in a case where (a) a spacer tape merely has protruding parts which have a low height or (b) a laminate spacer tape for a circuit production process on which protruding parts which have a low height are provided is used for shipping and transportation, a film surface of the spacer tape may be in contact with a TAB tape in a state where the space tape has been wound together with the TAB tape. In order to prevent device destruction which occurs because the spacer tape is rubbed by a contact and then charged, an electrical conducting material is blended or coated with the spacer tape, so that the spacer tape is electroconductive. Carbon is generally used as the electrical conducting material which suitably causes the spacer tape to be electroconductive. However, carbon alone has a resistance which is as high as that of a metal. In view of this, in a case where dusting occurs because the spacer tape is rubbed, a defect caused by leak is highly likely to occur.

In view of the above, from the viewpoint of product protection during shipping and transportation, it is impossible to merely cause the protruding parts to have a lower height. It is therefore impossible for the spacer tape 700 (see Patent Literature 2) and the laminate spacer tape (see Patent Literature 3) to achieve winding of a TAB tape of approximately 80 m on a small-sized reel which has a size of Φ 405 mm, while sufficiently securing protection of the TAB tape during shipping and transportation.

The present invention has been made in view of the problems, and its object is to provide a packing structure and an embossed tape each of which allows a TAB tape to be packaged in a desired winding length, while sufficiently securing protection of the TAB tape during shipping and transportation.

In order to attain the object, a semiconductor apparatus packaging structure of the present invention in which (i) a semiconductor apparatus including a plurality of semiconductor chips which are fixed, on a tape-like insulating film on which wiring patterns are repeatedly provided, so as to be electrically connected to the respective wiring patterns and (ii) an embossed tape which is electroconductive and has protruding parts which are sequentially provided on a first surface of and in a longitudinal direction of a tape-like electroconductive film are wound on a reel which is electroconductive is arranged such that the semiconductor apparatus and the embossed tape are wound on the reel, while (i) a first surface of the tape-like insulating film on which surface the plurality of semiconductor chips are fixed and (ii) the first surface of the tape-like electroconductive film from which surface the protruding parts protrude are overlapping and facing each other, and the embossed tape has a total thickness of not less than (t+0.4) mm and not more than 1.1 mm in a case where each of the plurality of semiconductor chips has a thickness of t ($0.2 \leq t \leq 0.625$) mm and the tape-like electroconductive film has a substantial thickness of 0.125 mm.

According to the arrangement, the semiconductor apparatus is sufficiently securely protected during shipping and transportation because the total thickness of the embossed tape is specified in accordance with the thickness of the semiconductor chip and the thickness of the tape-like electroconductive film. Note that for example, it has been conventionally considered as general that a semiconductor apparatus of approximately 40 m is wound on a small-sized reel which has a size of Φ 405 mm. Then, it has been impossible to wind the semiconductor apparatus having a recently-desired length of approximately 80 m on the small-sized reel which has a size of Φ 405 mm. In contrast, according to the arrangement, it is possible to wind the semiconductor apparatus of approximately 80 m on the small-sized reel which has a size of Φ 405 mm. This realizes packaging of a semiconductor apparatus in a desired winding length while sufficiently securing protection of the semiconductor apparatus during shipping and transportation.

The semiconductor apparatus packaging structure of the present invention is preferably arranged such that not less than 80 percent in area of (i) a second surface of the tape-like insulating film which surface is opposite to the first surface of the tape-like insulating film and (ii) a second surface of the tape-like electroconductive film which surface is opposite to the first surface of the tape-like electroconductive film are in surface-contact. This prevents a local rub between the two ((i) and (ii)) surfaces due to peaks of the protruding parts and thus allows dusting to be less likely to occur. Further, the contact of not less than 80 percent of (i) the embossed tape which is electroconductive and (ii) the second surface of the tape-like insulating film which surface is opposite to the first surface of the tape-like insulating film causes the tape-like insulating film on which the plurality of semiconductor chips are fixed to have a smaller amount of static charge generated by a vibration caused during transportation and allows a decrease in damage by static charge to the plurality of semiconductor chips.

Note that even if dusting occurs and then a dust is adhered to a semiconductor apparatus, no defect caused by leak occurs by causing an embossed tape to be highly electroconductive. In order to realize this, the semiconductor apparatus packaging structure of the present invention is desirably arranged such that the embossed tape has a surface resistance of not less than $10^6 \Omega$ and not more than $10^9 \Omega$. In particular, the embossed tape is desirably arranged to (i) be coated with a stable polymeric material (e.g., polythiophene, polypyrrole, or polyaniline) at a specific resistance of $10^6 \Omega$ to $10^9 \Omega$ and (ii) have an initial resistance even if dusting occurs. According to an embossed tape which is highly electroconductive (has a resistance of less than $10^6 \Omega$), charge transfer occurs as soon as it is charged. This causes high electric currents to flow to respective semiconductor chips and then static electricity may destroy the semiconductor chips. In contrast, in the case of an embossed tape which is insulative and has a resistance of more than $10^{12} \Omega$, electric charge continues to accumulate in the embossed tape and then an electrostatic breakdown occurs to semiconductor chips due to electrostatic charge which is caused when the semiconductor chips come into contact with the embossed tape.

The semiconductor apparatus packaging structure of the present invention is desirably arranged such that the embossed tape is made of polyethylene terephthalate resin, polyethylene naphthalate resin, polyimide resin, polyetherimide resin, polysulphone resin, polyethylene resin, polypropylene resin, polyamide resin, or polyether sulfine resin. This allows stable molding of an embossed tape.

The semiconductor apparatus packaging structure of the present invention is preferably arranged such that: a coefficient of friction between (i) the second surface of the tape-like insulating film and (ii) the second surface of the tape-like electroconductive film is set to not less than 0.3 and not more than 0.5; and a coefficient of friction between (i) the first surface of the tape-like insulating film and (ii) the first surface of the tape-like electroconductive film is set to not more than 0.3.

According to the arrangement, it is possible to prevent winding displacement of each of the semiconductor apparatus and the embossed tape due to a vibration caused during transportation from occurring between (i) the second surface of the tape-like insulating film and (ii) the second surface of the tape-like electroconductive film. In addition, (i) the first surface of the tape-like insulating film and (ii) the first surface of the tape-like electroconductive film are slippery, and it is therefore possible to prevent the semiconductor apparatus and the embossed tape from waving in a state where the semiconductor apparatus and the embossed tape have been wound on the reel.

The semiconductor apparatus packaging structure of the present invention is preferably arranged such that the number of the protruding parts is not less than 1.5 and not more than 3, per 20 mm in a longitudinal direction of the embossed tape. This allows the protruding parts to have a strength suitable to serve as cushioning against the semiconductor apparatus.

The semiconductor apparatus packaging structure of the present invention is preferably arranged to further include: an antistatic or a dampproof bag in which the reel on which the semiconductor apparatus and the embossed tape have been wound is contained; and a second box in which a plurality of first boxes are contained and which has a larger size than each of the first boxes, in each of the first boxes the antistatic or dampproof bag being contained. An example of the antistatic or dampproof bag is an aluminum-laminated bag. The aluminum-laminated bag is preferable because it is both antistatic and dampproof.

According to the arrangement, it is possible to suitably package a semiconductor apparatus for shipping and transportation. Note that according to a reel on which the semiconductor apparatus and an embossed tape have been wound, the semiconductor apparatus is made longer. For example, the semiconductor apparatus of approximately 80 m is wound according to such a reel which has a size of $\Phi$ 405 mm, whereas the semiconductor apparatus of approximately 40 m has been conventionally wound. In view of this, the semiconductor apparatus which is two times longer as compared to a conventional one is packaged in the second box. This allows the semiconductor apparatus which is two times longer to be stored in a storage space in which the second box has been conventionally stored. This allows an improvement in productivity per floor area. Note that it is possible to reduce, by 4 kg per shipping, a weight of a packaging structure at the time of shipping from 17 kg to 13 kg. This can also reduce shipping operations. In addition, it is possible to reduce costs of shipping and transportation.

A semiconductor apparatus packaging method of the present invention in which (i) a semiconductor apparatus including a plurality of semiconductor chips which are fixed, on a tape-like insulating film on which wiring patterns are repeatedly provided, so as to be electrically connected to the respective wiring patterns and (ii) an embossed tape which is electroconductive and has protruding parts which are sequentially provided on a first surface of and in a longitudinal direction of a tape-like electroconductive film are wound on a reel which is electroconductive, the method includes the steps of: winding the semiconductor apparatus and the embossed tape on the reel, while causing (i) a first surface of the tape-like insulating film on which surface the plurality of semiconductor chips are fixed and (ii) the first surface of the tape-like electroconductive film from which surface the protruding parts protrude to overlap and face each other, and using the embossed tape which has a total thickness of not less than (t+0.4) mm and not more than 1.1 mm in a case where each of the plurality of semiconductor chips has a thickness of t ($0.2 \leqq t \leqq 0.625$) mm and the tape-like electroconductive film has a substantial thickness of 0.125 mm.

According to the arrangement, the semiconductor apparatus is sufficiently securely protected during shipping and transportation because the embossed tape is used which has the total thickness specified in accordance with the thickness of the semiconductor chip and the thickness of the tape-like electroconductive film. Note that for example, it has been conventionally considered as general that a semiconductor apparatus of approximately 40 m is wound on a small-sized reel which has a size of $\Phi$ 405 mm. Then, it has been impossible to wind the semiconductor apparatus having, recently-desired length of approximately 80 m on the small-sized reel which has a size of $\Phi$ 405 mm. In contrast, according to the arrangement, it is possible to wind the semiconductor apparatus of approximately 80 m on the small-sized reel which has a size of $\Phi$ 405 mm. This realizes packaging of a semiconductor apparatus in a desired winding length while sufficiently securing protection of the semiconductor apparatus during shipping and transportation.

The semiconductor apparatus packaging method of the present invention is preferably arranged such that the semiconductor apparatus and the embossed tape are wound on the reel while a tension of not less than 10 gf and not more than 200 gf is being applied to the semiconductor apparatus and the embossed tape so that not less than 80 percent in area of (i) a second surface of the tape-like insulating film which surface is opposite to the first surface of the tape-like insulating film and (ii) a second surface of the tape-like electroconductive film which surface is opposite to the first surface of the tape-like electroconductive film are in surface-contact. This prevents a local rub between the two ((i) and (ii)) surfaces due to peaks of the protruding parts and thus allows dusting to be less likely to occur. Further, the contact of not less than 80 percent of (i) the embossed tape which is electroconductive and (ii) the second surface of the tape-like insulating film which surface is opposite to the first surface of the tape-like insulating film causes the tape-like insulating film on which the plurality of semiconductor chips are fixed to have a smaller amount of static charge generated by a vibration caused during transportation and allows a decrease in damage by static charge to the plurality of semiconductor chips.

The semiconductor apparatus packaging method of the present invention is preferably arranged to further include: preparing a plurality of reels, a plurality of antistatic or dampproof bags, and a plurality of first boxes; causing each of the plurality of reels on which the semiconductor apparatus and the embossed tape have been wound to be contained in each of the plurality of antistatic or dampproof bags; causing each of the plurality of antistatic or dampproof bags to be contained in each of the first boxes; and causing the plurality of first boxes to be contained in a second box which has a larger size than each of the plurality of first boxes. An example of the antistatic or dampproof bag is an aluminum-laminated bag. The aluminum-laminated bag is preferable because it is both antistatic and dampproof.

According to the arrangement, it is possible to suitably package a semiconductor apparatus for shipping and transportation. Note that according to a reel on which the semiconductor apparatus and an embossed tape have been wound, the semiconductor apparatus is made longer. For example, the semiconductor apparatus of approximately 80 m is wound according to such a reel which has a size of Φ 405 mm, whereas the semiconductor apparatus of approximately 40 m has been conventionally wound. In view of this, the semiconductor apparatus which is two times longer as compared to a conventional one is packaged in the second box. This allows the semiconductor apparatus which is two times longer to be stored in a storage space in which the second box has been conventionally stored. This allows an improvement in productivity per floor area. This can also reduce shipping operations. In addition, it is possible to reduce costs of shipping and transportation.

An embossed tape of the present invention, which is electroconductive, includes (i) a tape-like monolayer electroconductive film and (ii) protruding parts which are sequentially formed by embossing on a first surface of and in a longitudinal direction of the tape-like monolayer electroconductive film, the embossed tape having (i) a total thickness of not less than 0.6 mm and not more than 1.1 mm, and (ii) a surface resistance of not less than $10^6 \Omega$ and not more than $10^9 \Phi$.

According to the arrangement, it is possible for the embossed tape to function as an embossed tape for shipping and transportation, that is, to serve as cushioning against a semiconductor apparatus. Note that it is easy to thermally deform the embossed tape so as to carry out embossing because the embossed tape is made of a monolayer. Note also that the protruding parts are easily height-adjustable. This realizes packaging of a semiconductor apparatus in a desired winding length while sufficiently securing protection of the semiconductor apparatus with which the embossed tape is wound on a reel.

The embossed tape of the present invention is preferably arranged such that a pitch at which the protruding parts are provided in the longitudinal direction of the embossed tape is set so that the number of the protruding parts is not less than 1.5 and not more than 3, per 20 mm of the embossed tape. This allows the protruding parts to have a strength suitable to serve as cushioning against the semiconductor apparatus.

As described earlier, a semiconductor apparatus packaging structure of the present invention in which (i) a semiconductor apparatus including a plurality of semiconductor chips which are fixed, on a tape-like insulating film on which wiring patterns are repeatedly provided, so as to be electrically connected to the respective wiring patterns and (ii) an embossed tape which is electroconductive and has protruding parts which are sequentially provided on a first surface of and in a longitudinal direction of a tape-like electroconductive film are wound on a reel which is electroconductive is arranged such that the semiconductor apparatus and the embossed tape are wound on the reel, while (i) a first surface of the tape-like insulating film on which surface the plurality of semiconductor chips are fixed and (ii) the first surface of the tape-like electroconductive film from which surface the protruding parts protrude are overlapping and facing each other, and the embossed tape has a total thickness of not less than (t+0.4) mm and not more than 1.1 mm in a case where each of the plurality of semiconductor chips has a thickness of t ($0.2 \leq t \leq 0.625$) mm and the tape-like electroconductive film has a substantial thickness of 0.125 mm.

Therefore, the semiconductor apparatus is sufficiently securely protected during shipping and transportation because the total thickness of the embossed tape is specified in accordance with the thickness of the semiconductor chip and the thickness of the tape-like electroconductive film. Note that for example, it has been conventionally considered as general that a semiconductor apparatus of approximately 40 m is wound on a small-sized reel which has a size of Φ 405 mm. Then, it has been impossible to wind the semiconductor apparatus having a recently-desired length of approximately 80 m on the small-sized reel which has a size of Φ 405 mm. In contrast, according to the arrangement, it is possible to wind the semiconductor apparatus of approximately 80 m on the small-sized reel which has a size of Φ 405 mm. This brings about an effect of realizing packaging of a semiconductor apparatus in a desired winding length while sufficiently securing protection of the semiconductor apparatus during shipping and transportation.

A semiconductor apparatus packaging method of the present invention in which (i) a semiconductor apparatus including a plurality of semiconductor chips which are fixed, on a tape-like insulating film on which wiring patterns are repeatedly provided, so as to be electrically connected to the respective wiring patterns and (ii) an embossed tape which is electroconductive and has protruding parts which are sequentially provided on a first surface of and in a longitudinal direction of a tape-like electroconductive film are wound on a reel which is electroconductive, the method includes the steps of: winding the semiconductor apparatus and the embossed tape on the reel, while causing (i) a first surface of the tape-like insulating film on which surface the plurality of semiconductor chips are fixed and (ii) the first surface of the tape-like electroconductive film from which surface the protruding parts protrude to overlap and face each other, and using the embossed tape which has a total thickness of not less than (t+0.4) mm and not more than 1.1 mm in a case where each of the plurality of semiconductor chips has a thickness of t ($0.2 \leq t \leq 0.625$) mm and the tape-like electroconductive film has a substantial thickness of 0.125 mm.

Therefore, the semiconductor apparatus is sufficiently securely protected during shipping and transportation because the embossed tape is used which has the total thickness specified in accordance with the thickness of the semiconductor chip and the thickness of the tape-like electroconductive film. Note that for example, it has been conventionally considered as general that a semiconductor apparatus of approximately 40 m is wound on a small-sized reel which has a size of Φ 405 mm. Then, it has been impossible to wind the semiconductor apparatus having a recently-desired length of approximately 80 m on the small-sized reel which has a size of Φ 405 mm. In contrast, according to the arrangement, it is possible to wind the semiconductor apparatus of approximately 80 m on the small-sized reel which has a size of Φ 405 mm. This brings about an effect of realizing packaging of a semiconductor apparatus in a desired winding length while sufficiently securing protection of the semiconductor apparatus during shipping and transportation.

An embossed tape of the present invention, which is electroconductive, includes (i) a tape-like monolayer electroconductive film and (ii) protruding parts which are sequentially formed by embossing on a first surface of and in a longitudinal direction of the tape-like monolayer electroconductive film, the embossed tape having (i) a total thickness of not less than 0.6 mm and not more than 1.1 mm, and (ii) a surface resistance of not less than $10^6 \Phi$ and not more than $10^9 \Phi$.

Therefore, it is possible for the embossed tape to function as an embossed tape for shipping and transportation, that is, to serve as cushioning against a semiconductor apparatus. Note that it is easy to thermally deform the embossed tape so as to carry out embossing because the embossed tape is made of a monolayer. Note also that the protruding parts are easily height-adjustable. This brings about an effect of realizing packaging of a semiconductor apparatus in a desired winding length while sufficiently securing protection of the semiconductor apparatus with which the embossed tape is wound on a reel.

BRIEF DESCRIPTION OF DRAWINGS

FIG. 17 is a chart showing a winding length of the TAB tape in accordance with a total thickness of the embossed tape in the case of the reel which has a winding outline size of Φ 380 mm.

FIG. 18 is a chart showing a winding length of the TAB tape in accordance with a total thickness of the embossed tape in the case of the reel which has a winding outline size of Φ 385 mm.

REFERENCE SIGNS LIST

Figure 1:
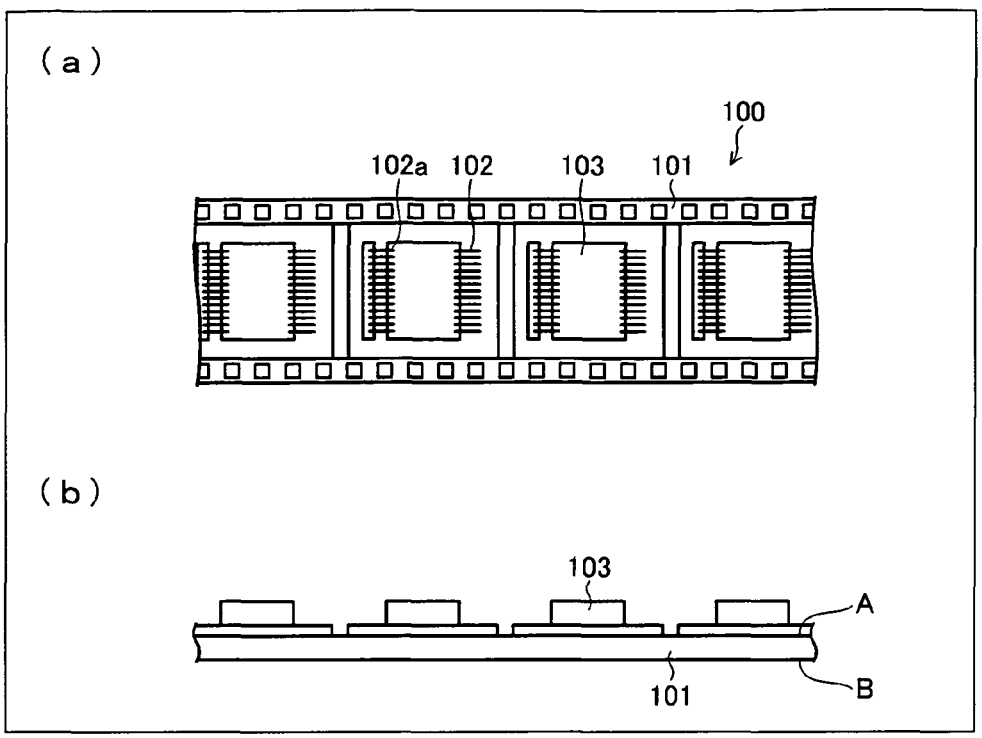
FIG. 1 illustrates an arrangement of a TAB tape. (a) of FIG. 1 is a top view, and (b) of FIG. 1 is a side view.

100 TAB tape (Semiconductor apparatus)
101 Film (Insulating film)
102 Wiring pattern
103 Semiconductor chip
200, 210, 220, 230, 240 Embossed tape
201 Film (Electroconductive film)
202 Embossed part (Protruding part)
211, 212, 221, 222, 231, 232, 241
Embossed part (Protruding part)
242 Material identifying section
310 Reel
311 Core section
320 Antistatic bag (Bag)
330 Interior packaging case (First box)
340 Exterior packaging case (Second box)

DESCRIPTION OF EMBODIMENTS

An embodiment of the present invention is described below with reference to the drawings.

The present invention is directed to a technique in which (i) a TAB tape, which has a tape length which has been conventionally too long to be wound, is wound on a reel together with an embossed tape, and then (ii) the TAB tape is put (wrapped) into a package for shipping and transportation. The following description first discusses arrangements of respective members of a preferred embodiment of the present invention, and subsequently discusses a packaging method and a packaging structure in each of which the respective members are used.

(Arrangement of Tab Tape)

FIG. 1 illustrates an arrangement example of a TAB tape 100. (a) of FIG. 1 is a top view, and (b) of FIG. 1 is a side view.

According to the TAB tape 100, semiconductor devices each of which includes a package of a wiring pattern 102 and a semiconductor chip 103 are sequentially (repeatedly) provided, in a longitudinal direction of the TAB tape 100, on one surface of a film 101 (an insulating film) which is long and tape-shaped. The wiring pattern 102 includes inner leads 102a formed by a general circuit production process. The semiconductor chip 103 is fixed so as to be electrically connected to the inner leads 102a. Note here that the surface of the TAB tape 100 on which surface the wiring pattern 102 is provided and the semiconductor chip 103 is mounted is referred to as a semiconductor front surface A and a surface of the TAB tape 100 which surface is opposite to the semiconductor front surface A is referred to as a semiconductor rear surface B.

The film 101 is insulative and is made of an organic resin material such as polyimide. The film 101 has a thickness of 30 μm to 40 μm and a width of 48 mm. Note that the film 101 has, at opposite ends in its width direction, respective transporting parts which have holes called sprocket holes which are sequentially provided for transportation. Only a part of the TAB tape 100 on which part each of the driver ICs is punched out by a metal mold is used.

The wiring pattern 102 is formed by electroconductive thin-film leads each made of copper and has its surface plated with tin and Bi (0.1 μmt to 0.5 μmt). The electroconductive thin-film leads each have, at its end, at least the inner lead 102a, an outer lead, and a test pad. Wirings are coated with a solder resist (SR), except the outer leads used by a user as a bonding part and the inner leads 102a for mounting the semiconductor chip.

The semiconductor chip 103 includes, on its one surface, a plurality of protruding metal electrodes (bumps) (not illustrated) which are made of gold and via each of which an electric signal is inputted and outputted. The plurality of protruding metal electrodes and the respective inner leads 102a are pressurized and heated, and then gold and tin form an eutectic crystal, which means completion of the bonding of the plurality of protruding metal electrodes and the inner leads 102a. This causes the semiconductor chip 103 to be firmly fixed on the film 101. The plurality of protruding metal electrodes are preferably made of gold, and instead can be made of another metal, which has a low electric resistance, such as nickel or aluminum. Note that the semiconductor chip 103 is set to have a thickness of 200 μm to 625 μm by grinding a rear surface of a wafer such as an 8-inch wafer which has a thickness of approximately 725 μm or a 6-inch wafer which has a thickness of approximately 625 μm.

Note that the TAB tape 100 (see FIG. 1), which has a structure of COF, has (i) no opening section of a part of the film 101 on which part the semiconductor chips 103 are provided and (ii) no slit for bending the TAB tape 100. A structure of the TAB tape 100 is not limited to COF, provided that the TAB tape 100 has a structure in which a TAB technique is employed. For example, the TAB tape 100 can have a structure of TCP.

(Arrangement of Embossed Tape)

Figure 2:
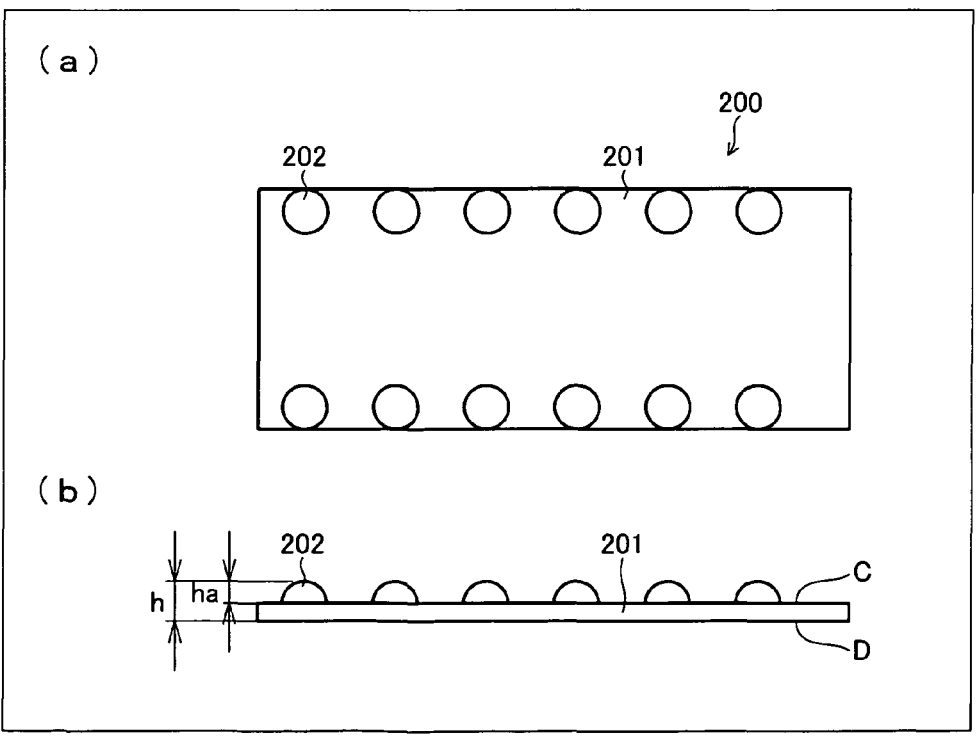
FIG. 2 illustrates an arrangement of an embossed tape used in a packing structure of the present invention. (a) of FIG. 1 is a top view, and (b) of FIG. 1 is a side view.

FIG. 2 illustrates an arrangement example of an embossed tape 200. (a) of FIG. 2 is a top view, and (b) of FIG. 2 is a side view.

According to the embossed tape 200, embossed parts 202 (protruding parts) formed by embossing are provided on one surface of a film 201 which is long and tape-shaped. Note here that the surface of the embossed tape 200 on which surface the embossed parts 202 are provided (peaks of the embossed parts 202 project) is referred to as an embossing front surface C and a surface of the embossed tape 200 which is opposite to the embossing front surface C is referred to as an embossing rear surface D.

The film 201 is a tape which is made of a resin of polyethylene terephthalate (PET) and is coated with an electroconductive material. The film 201 is preferably made of PET which is stably moldable, and instead can be made of polyethylene naphthalate resin, polyimide resin, polyetherimide resin, polysulphone resin, polyethylene resin, polypropylene resin, polyamide resin, or polyether sulfine resin.

Note that the film 201 is coated with an electroconductive polymeric material and set to have an electroconductive property (a surface resistance) of $10^6 \Omega$ to $10^9 \Omega$, preferably $10^8 \Omega$ to $10^9 \Omega$. The film 201 has a thickness of 125 μm. A width of the film 201 can be variously changed in accordance with a design, and it is preferable that the film 201 have a width which is substantially identical to the width of the TAB tape 100. For example, in a case where the film 101 of the TAB tape 100 has a width of 48 mm, it is desirable that the film 201 have a width of 48 mm±0.5 mm. The film 201, on which the embossed parts 202 have not yet been provided, has the front and rear surfaces which are flat. The film 201, on which the embossed parts 202 have been provided, also has the front and rear surfaces which are flat, except in a region where the embossed parts 202 are provided.

Each of the embossed parts 202 has a function of securing a space between the semiconductor front surface A of the TAB tape 100 and the embossing front surface C of the embossed tape 200 so as to prevent an interference of the TAB tape 100 with the wiring patterns 102 and the semiconductor chips 103 in a state where the embossed tape 200 and the TAB tape 100 are wound together on a reel while the semiconductor front surface A of the TAB 100 and the embossing front surface C of the embossed tape 200 are overlapping and facing each other. Namely, the embossed parts 202 serve as cushioning. The embossed parts 202 are sequentially provided at regular intervals in a longitudinal direction of the film 201, at opposite ends extending in a width direction of the film 201.

The embossed parts 202 can be provided, in accordance with a design, at least so that apexes of the respective embossed parts 202 are in contact with the respective transporting parts of the TAB tape 100 in a state where the TAB tape 100 as mentioned above and the embossed tape 200 are wound together on the reel. For example, in a case where a bottom surface of the embossed part 202 has a diameter of Φ 5 mm, (i) the embossed parts 202 are provided in the width direction so as to be 44 mm±0.2 mm away from a center of the embossed tape 200 and (ii) the embossed parts 202 are provided in the longitudinal direction at a pitch of 10.5 mm±0.5 mm. For example, in a case where the film 201 has a width of 35 mm/70 mm, the embossed parts 202 are provided at a pitch of 31 mm/63 mm in the width direction. Note that it is preferable that an arrangement pitch at which the embossed parts 202 are provided in the longitudinal direction be set so that the number of the embossed parts 202 provided, per 20 mm of the embossed tape 200 is not less than 1.5 and not more than 3. This makes it possible to suitably specify a strength of the embossed part 202 serving as cushioning.

Note that each of the embossed parts 202 is semispherical (domed) and a height ha of the embossed part 202 defined by a distance between the embossing front surface C and the apex is found based on a total thickness h (=a thickness of the film 201+the height ha of the embossed part 202) of the embossed tape 200 which thickness is set in view of a thickness of the semiconductor chip 103 mounted on the TAB tape 100 which is wound together with the embossed tape 200. For example, in a case where the semiconductor chip 103 has a thickness t of "200 μm≦t≦625 μm", the embossed tape 200 is specified to have the total thickness h of "not less than (t+0.4) mm≦h≦1.1 mm". The film 201 has a thickness of 125 μm, and the height ha is therefore "(t+0.275) mm≦ha≦0.975 mm".

Figure 3:
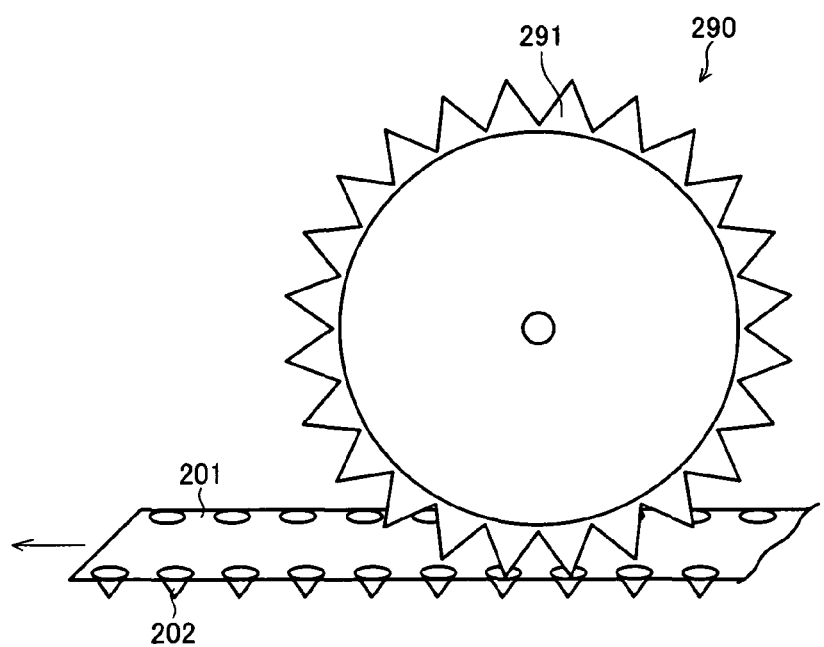
FIG. 3 is a schematic view illustrating a production process of the embossed tape.

For example, the embossed parts 202 are formed by thermo molding of teeth 291 in which the film 201 is forwarded while a gear 290 of an embossing molding device is being rotated (see FIG. 3). Accordingly, it is possible to (i) change a shape of the embossed part 202 in conformity with a tip shape of each of the teeth 291 and (ii) change the height ha of the embossed part 202 in accordance with where the lowest tip of the tooth 291 is located. Note that it is preferable that the embossed tape 200 have a Young's modulus of 400N/mm² to 700N/mm².

As described earlier, the embossed tape 200 is a long tape which has the embossed parts 202 formed by embossing on one surface of the film 201 which is single-layered, and has a feature such that a plurality of the embossed parts 202 are sequentially provided at regular intervals in two lines in the longitudinal direction of the film 201, at the respective opposite ends in the width direction of the film 201.

Note that an arrangement of the embossed tape 200 is not limited to the arrangement illustrated in FIG. 2 and therefore the embossed parts 202 can be differently provided or shaped, provided that the embossed tape 200 carries out the function as mentioned above. The following description discusses further arrangement examples of the embossed tape 200.

Figure 4:
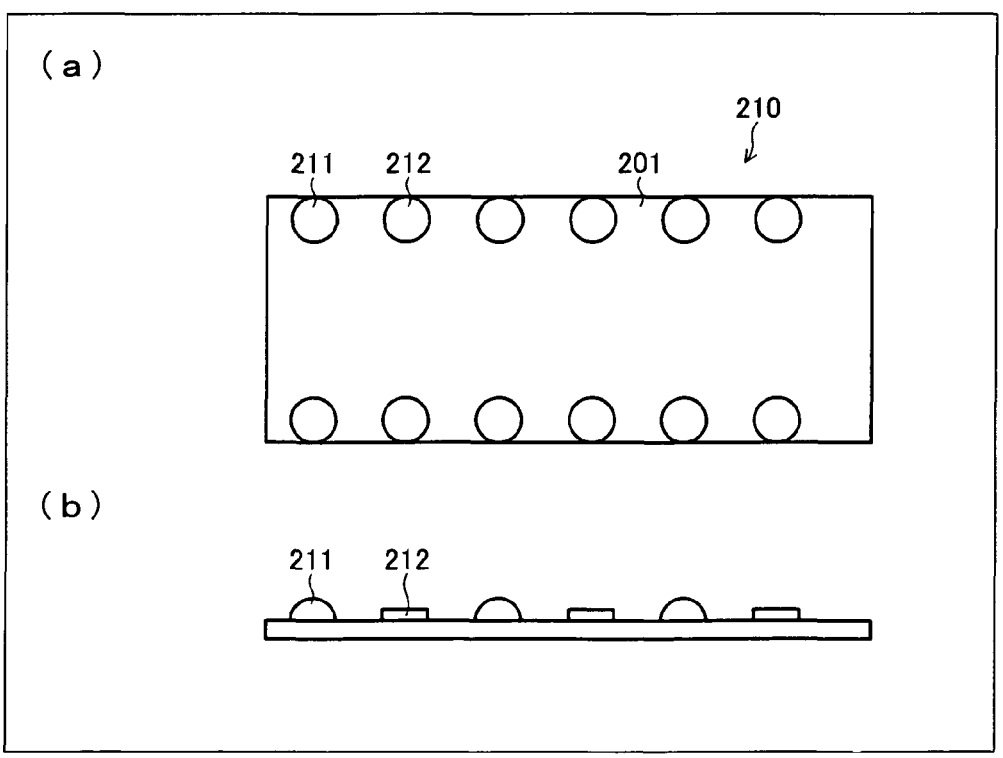
FIG. 4 illustrates another arrangement of the embossed tape. (a) of FIG. 4 is a top view, and (b) of FIG. 4 is a side view.

According to an embossed tape 210 (see (a) and (b) of FIG. 4), a film 201 has, on its one surface, embossed parts 211 which are domed and embossed parts 212 which are cylindrical. The embossed parts 211 and the embossed parts 212 are alternately provided at regular intervals in a longitudinal direction of the film 201, at opposite ends in a width direction of the film 201. This can prevent the embossed tape 210 from waving.

Figure 5:
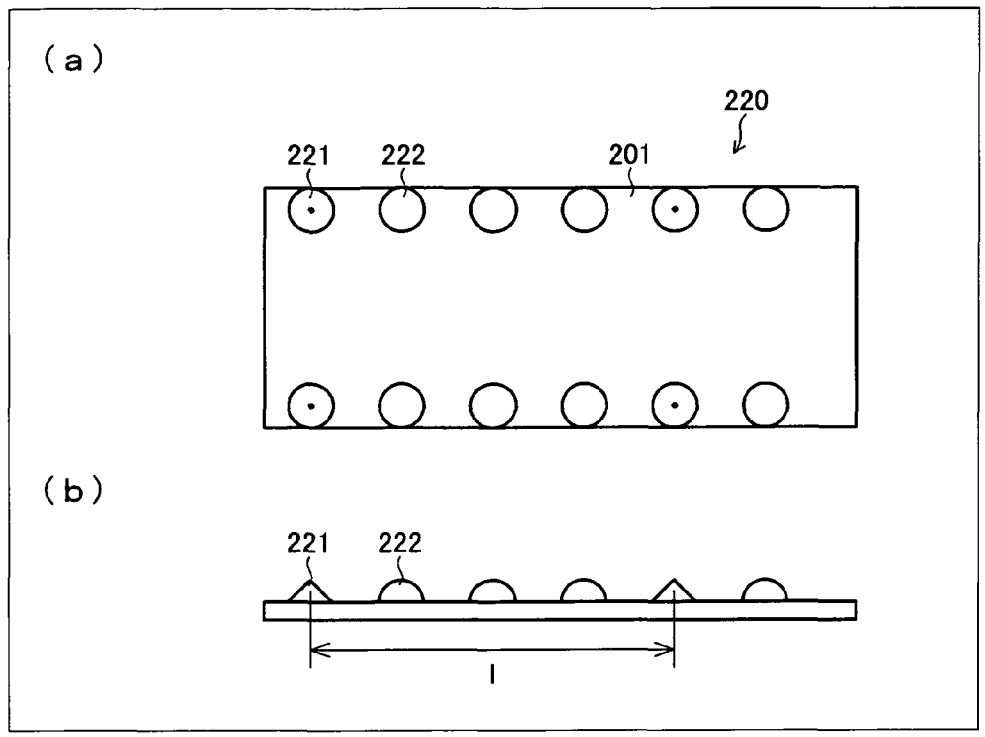
FIG. 5 illustrates a further arrangement of the embossed tape. (a) of FIG. 5 is a top view, and (b) of FIG. 5 is a side view.

According to an embossed tape 220 (see (a) and (b) of FIG. 5), a film 201 has, on its one surface, embossed parts 221 which are conical and embossed parts 222 which are domed. The embossed parts 221 and the embossed parts 222 are provided, at regular intervals in a longitudinal direction of the film 201, at opposite ends in a width direction of the film 201, so that the embossed parts 221 are spaced at a given interval 1. Namely, the embossed part 221, the embossed part 222, the embossed part 222, the embossed part 222, the embossed part 221 . . . are provided in this order. According to this, it is possible to find out an interval between the respective embossed parts 221 by checking a space between the embossed parts 221. This allows control of a length of the embossed tape 220.

Figure 6:
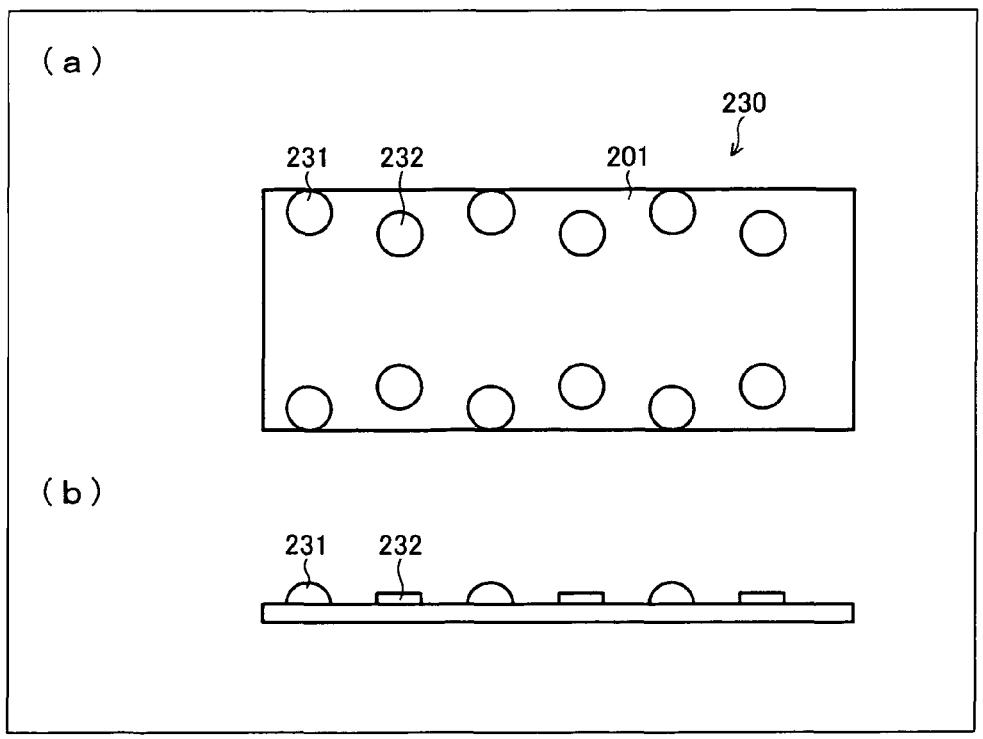
FIG. 6 illustrates a further arrangement of the embossed tape. (a) of FIG. 6 is a top view, and (b) of FIG. 6 is a side view.
Figure 7:
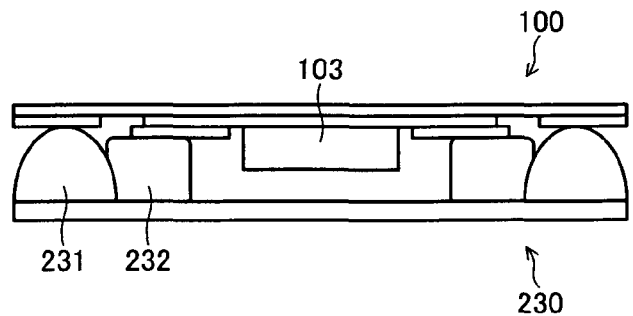
FIG. 7 is a cross-sectional view illustrating a state where the embossed tape, together with the TAB tape, is wound on a reel.

According to an embossed tape 230 (see (a) and (b) of FIG. 6), a film 201 has, on its one surface, embossed parts 231 which are domed and embossed parts 232 which are pot-shaped. The embossed parts 231 and the embossed parts 232 are alternately provided, at regular intervals in a longitudinal direction of the film 201, at opposite ends in a width direction of the film 201, so that a distance between the embossed parts 232 which face each other in the width direction is shorter than a distance between the embossed parts 231 which face each other in the width direction. Note that the embossed part 232 has a lower height than the embossed parts 231.

Figure 20:
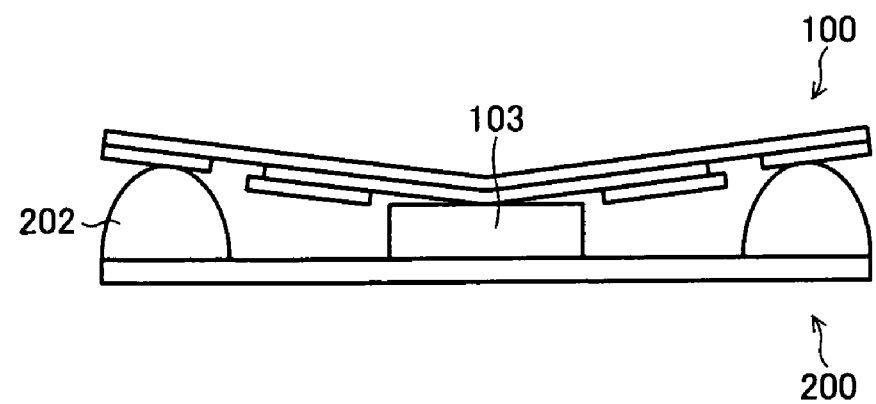
FIG. 20 is a cross-sectional view illustrating a case where the semiconductor chip and the embossed tape come into contact due to a warp in the TAB tape.

In a case where the embossed parts 202 are provided at long intervals, the film 101 may deform mainly in the vicinities of the semiconductor chips 103 in a state where the embossed tape 200 has been wound together with the TAB tape 100 (see FIG. 20). In contrast, according to the embossed tape 230, it is possible to prevent a deformation of the film 101 by causing the embossed parts 232 to be in contact with the SR. Note that the height of the embossed part 232 can be determined in accordance with a total thickness (a PI-based material thickness+a wiring thickness+and SR thickness) of a film product and it is preferable that the embossed part 232 be set to have a height which is approximately 100 μm lower than that of the embossed part 231.

Figure 8:
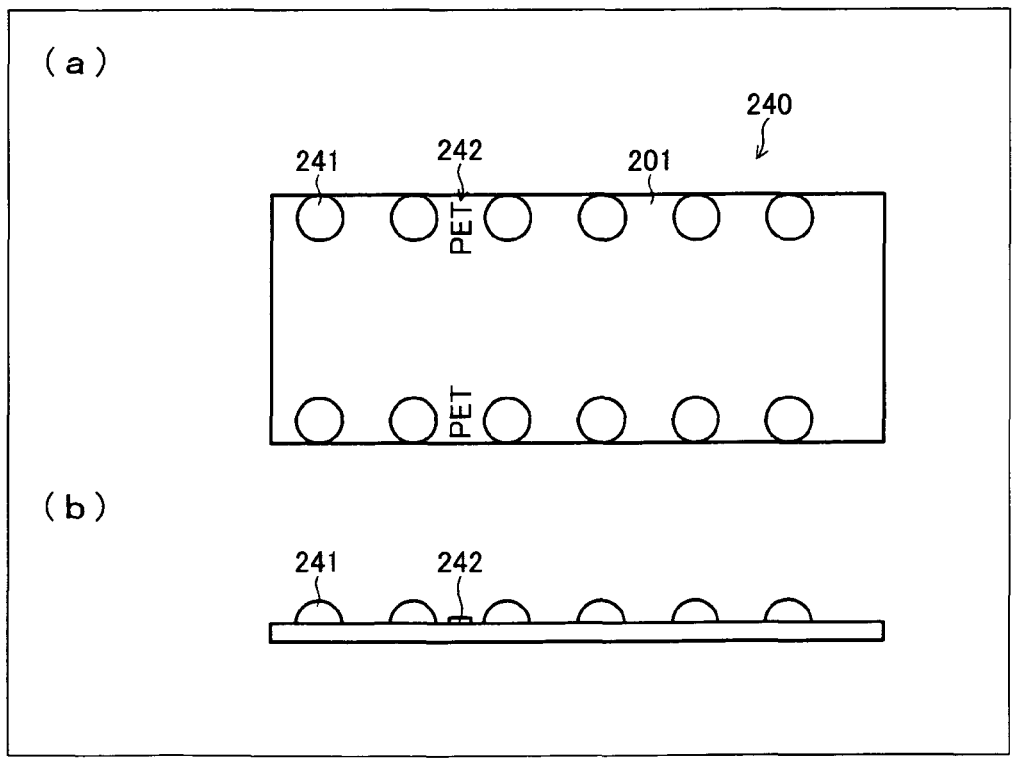
FIG. 8 illustrates a further arrangement of the embossed tape. (a) of FIG. 8 is a top view, and (b) of FIG. 8 is a side view.

According to an embossed tape 240 (see (a) and (b) of FIG. 8), a film 201 has, on its one surface, embossed parts 241 which are domed (conical). The embossed parts 241 are sequentially provided, at regular intervals in a longitudinal direction of the film 201, at opposite ends in a width direction, of the film 201. Material identifying sections 242 on each of which a material name (e.g., PET) of the embossed tape 240 is written are provided between the respective embossed parts 241. The material identifying sections 242 can be molded by a conventionally general method so as to protrude on a surface on which the embossed parts 241 are provided. A method for molding the material identifying sections 242 is not particularly limited, provided that the material identifying sections 242 do not interfere with other members in terms of their height and place. This allows a material to be recognized only through visual inspection during embossing and/or at the time of disposal.

(Members for Packaging)

Several members (subsidiary members) are used so as to cause the TAB tape 100 to be packaged for shipping and transportation. Note here that the following description discusses representative examples of the subsidiary members.

Figure 9:
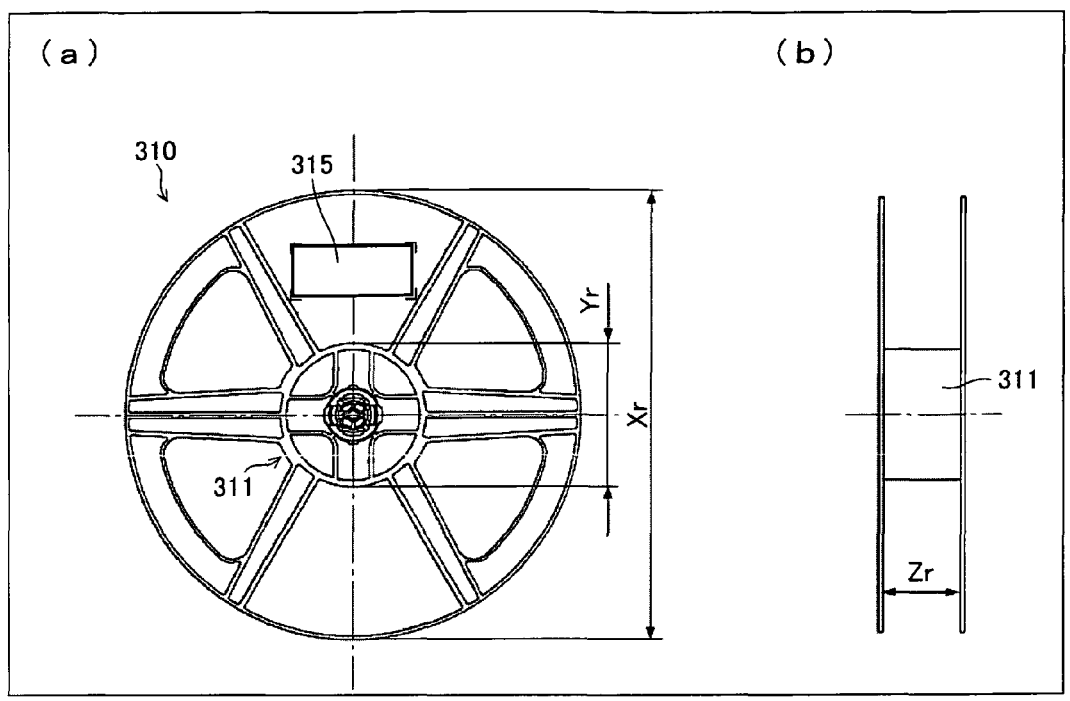
FIG. 9 illustrates an arrangement of the reel. (a) of FIG. 9 is an elevation view, and (b) of FIG. 9 is a side view.

Firstly, one of the subsidiary members is a reel on which the TAB tape 100 is wound. (a) and (b) of FIG. 9 illustrates an outer shape of a reel 310. The reel 310 is molded from a resin such as PS (polystyrene) or ABS (acrylonitrile, butadiene, or styrene) and is electroconductive so as not to be charged. The reel 310 has a core section 311 around which a tape is wound. A reel which has an outermost size Xr of Φ 405 mm/Φ 530 mm is generally distributed. For example, according to the reel 310 which has the outermost size Xr of Φ 405 mm, the core section 311 has an outer size Yr of Φ 125 mm and a width Zr of 49 mm. A description of a specific shape of the reel is unimportant in the present invention and is therefore omitted here. Such a conventional reel can be used as the reel for the present invention. This allows a lower cost than in a case where a reel is produced from scratch.

Note that a shipping label 315 is provided on a part of the reel 310 so as to be easily visible. The shipping label 315 specifies information, on what is wound on the reel 310, such as (i) a model name, (ii) a quantity, and (iii) a shipping date of a semiconductor apparatus provided on the TAB tape 100

Figure 13:
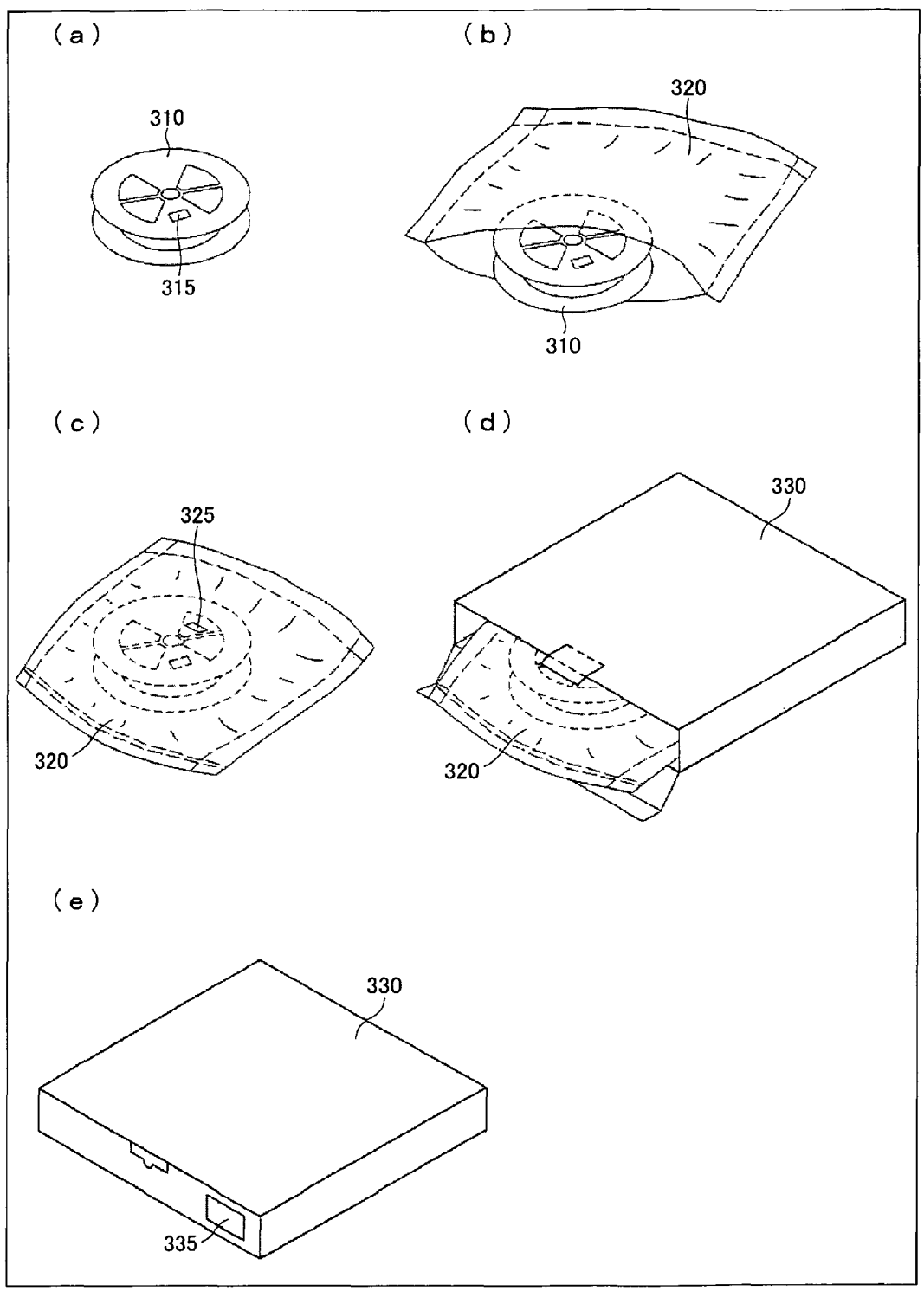
FIG. 13 (a) through (e) of FIG. 13 illustrate steps in which the reel on which the TAB tape and the embossed tape has been wound is being contained in the interior packaging case.

Secondly, another of the subsidiary members is an antistatic bag in which the reel 310 on which the TAB tape 100 and the embossed tape 200 have been wound is contained. (b) and (c) of FIG. 13 illustrate an outer shape of an antistatic bag 320. The antistatic bag 320 used in the present embodiment is a bag which is aluminum-laminated and has a size corresponding to an outer size of the reel 310. Note that an aluminum-laminated dampproof bag can be used instead of the antistatic bag 320 as needed. An aluminum-laminated bag is preferable because it is both antistatic and dampproof.

Figure 10:
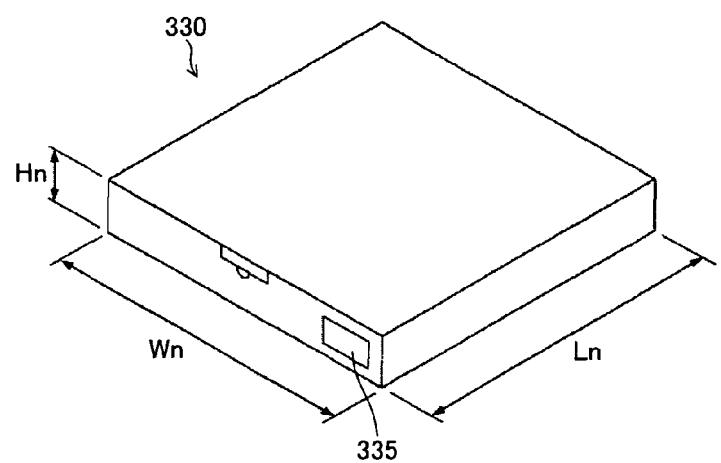
FIG. 10 is a perspective view illustrating an arrangement of an interior packaging case.

Thirdly, a further of the subsidiary members is an interior packaging case where the antistatic bag 320 in which the reel 310 is sealed is contained. FIG. 10 illustrates an outer shape of an interior packaging case 330. The interior packaging case 330 (a first box) used in the present embodiment is a cardboard box which has a size corresponding to the outer size of the reel 310. For example, the interior packaging case 330 for containing the reel 310 which has the outermost size of Φ 405 mm has a length Ln of 420 mm, a width Wn of 420 mm, and a height Hn of 65 mm. Note that in order to specify information on what is interiorly packaged, a shipping label 335 is provided on a part of the interior packaging case 330 so as to be easily visible.

Figure 14:
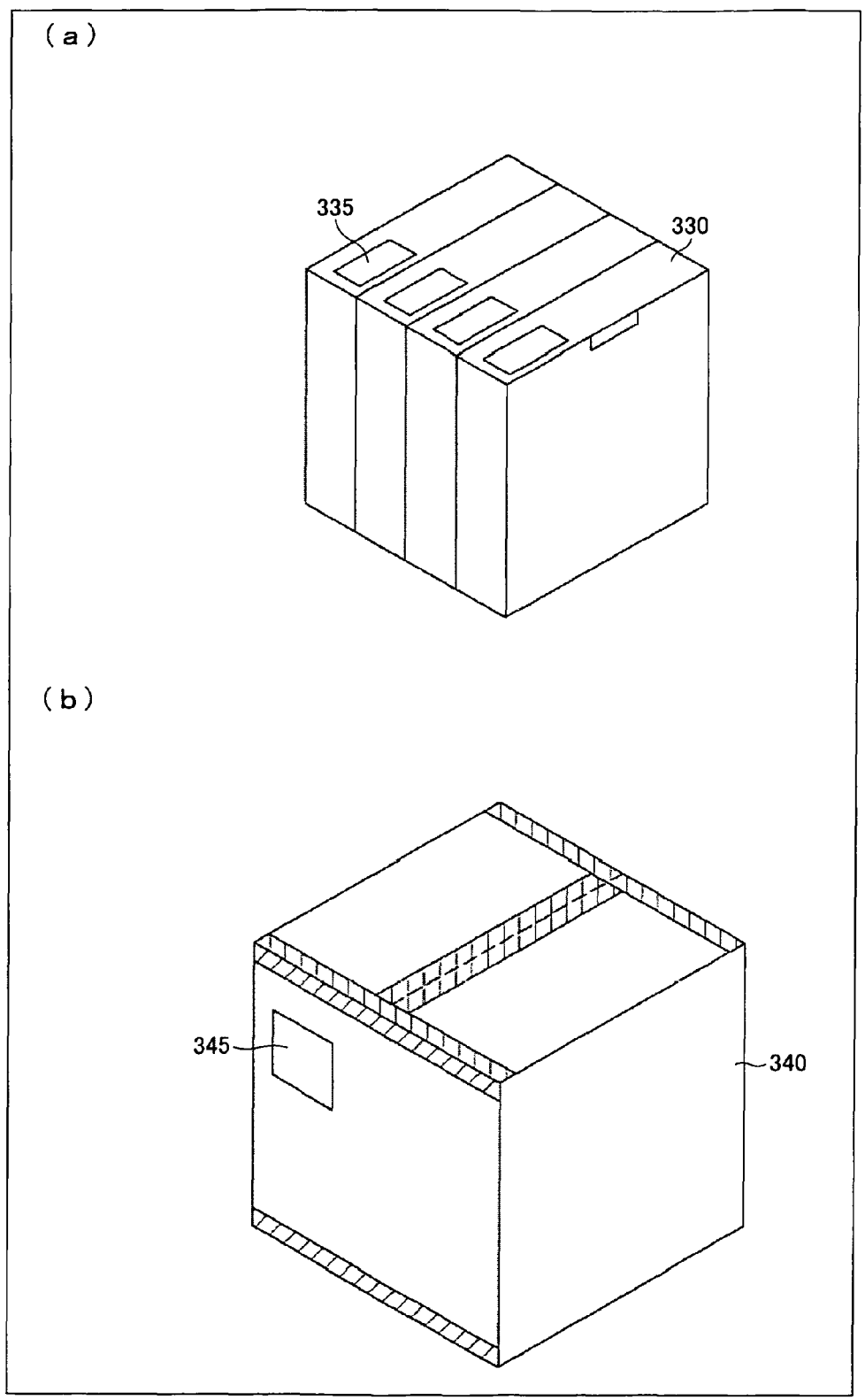
FIG. 14 (a) and (b) of FIG. 14 illustrate steps in which the interior packaging cases are being contained in an exterior packaging case.

Fourthly, still a further of the subsidiary members is an exterior packaging case in which the interior packaging case 330 is contained for shipping and transportation. (b) of FIG. 14 illustrates an outer shape of an exterior packaging case 340. The exterior packaging case 340 (a second box) is a cardboard box which has a size corresponding to an outer size of the interior packaging case 330. The exterior packaging case 340 has a size enough to contain a plurality of interior packaging cases 330. Specifically, a conventional exterior packaging case 340 can contain five (5) reels each having a width of 35 mm, four (4) reels each having a width of 48 mm, or three (3) reels having a width of 70 mm. This realizes more efficient shipping and transportation, and ultimately enhances productivity.

Note that the subsidiary materials such as the antistatic bag 320, the interior packaging case 330, and the exterior packaging case 340 correspond to the outer size of the reel 310 which has been distributed. It follows that it is possible to use the subsidiary materials so as to contain the plurality of reels 310. This allows a further reduction in cost as compared to a case where a reel is produced from scratch.

(Packaging Method and Packaging Structure of the TAB Tape)

The following description discusses a process flow in which the TAB tape 100 (see FIG. 1) and the embossed tape 200 (see FIG. 2) are wound together on the reel 310 (see FIG. 9) and then packaged for shipping and transportation.

Note that according to the TAB tape 100 used in the process flow described below, the film 101 has a thickness of 38 μm+8 μm (46 μm) and a width of 48 mm and the semiconductor chip 103 has a thickness of 625 μm. According to the embossed tape 200, the film 201 has a thickness of 125 μm and a width of 48 mm and the embossed part 202 has a height of 975 μm. Namely, the embossed tape 200 has a total thickness of 1.1 mm. The reel 310 which has a size of ED 405 mm is used, and the antistatic bag 320 and the interior packaging case 330 which have respective sizes corresponding to the size of the reel 310 are used. Note that the exterior packaging case 340 which has a size enough to contain four (4) interior packaging cases 330 (a height H: 65 mm) is used.

Figure 11:
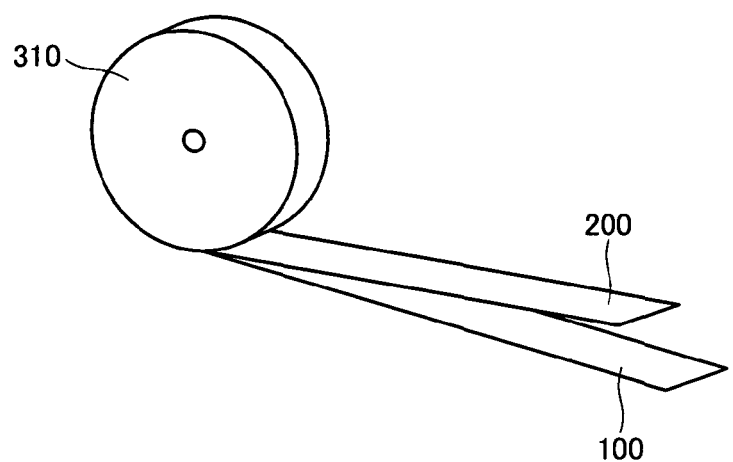
FIG. 11 is a schematic view illustrating how the TAB tape and the embossed tape are being wound on the reel.

FIG. 11 is a drawing illustrating a state where the TAB tape 100 and the embossed tape 200 are being wound together on the reel 310.

First, the TAB tape 100 and the embossed tape 200 which overlap each other are caused to be caught by the core section 311 of the reel 310, and then the reel 310 is caused to rotate. Subsequently, the TAB tape 100 and the embossed tape 200 are being wound on the reel 310 while overlapping each other (see FIG. 11). In this case, the semiconductor front surface A of the TAB tape 100 and the embossing front surface C of the embossed tape 200 overlap each other so as to face each other.

Note that the TAB tape 100 and the embossed tape 200 are being wound on the reel 310 by applying a tension (winding pressure) to the respective tapes in their respective longitudinal directions (by pulling the respective tapes in their longitudinal directions) while the semiconductor rear surface B of the TAB tape 100 and the embossing rear surface D of the embossed tape 200 are being in as large a surface-contact as possible, preferably in a surface-contact of not less than 80%. Such a tension is preferably 10 gf to 300 gf, more preferably 50 gf to 200 gf. Note that a tension of not more than 10 gf is not preferable because it causes a winding displacement of each of the TAB tape 100 and the embossed tape 200 due to a vibration caused during transportation, thereby ultimately causing the TAB tape 100 and the embossed tape 200 to be warped. For this reason, when a user tried to take out the TAB tape for use by attaching the reel to a device via which the TAB tape was to be mounted on a liquid crystal panel, the user was not able to take out the TAB tape. Note also that a tension of not less than 200 gf is not preferable because it causes a problem that the TAB tape on which the semiconductor chips are mounted is deformed to be in the shape of the embossed parts.

Figure 12:
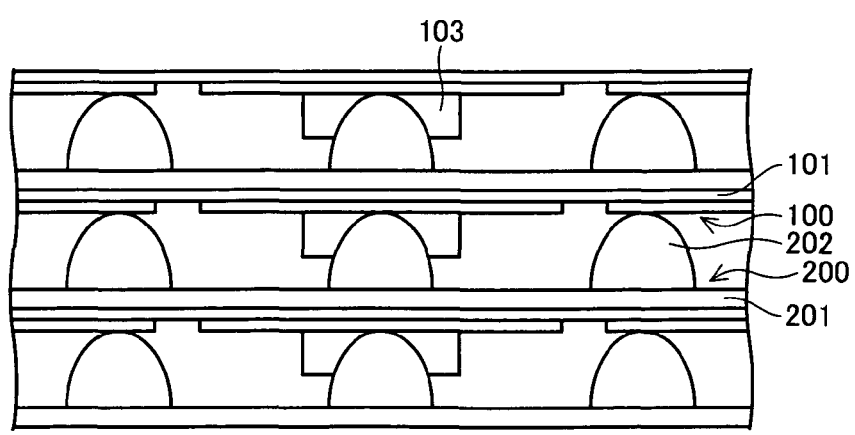
FIG. 12 is a cross-sectional view illustrating the packing structure of the present invention.

FIG. 12 is a cross-sectional view illustrating a state where the TAB tape 100 and the embossed tape 200 have been wound. The embossed parts 202 cause a gap to be secured between the semiconductor front surface A of the TAB tape 100 and the embossing front surface C of the embossed tape 200. This prevents the semiconductor chips 103 from making contact with and rubbing against the embossed tape 200.

Note that, in a case where the reel 310 which has a size of Φ 405 mm is used, a suitable winding circumference of a product has a maximum length of Φ 380 mm in view of workability in subsequent processes. This causes the TAB tape 100 and the embossed tape 200 to be wound together until the winding circumference reaches Φ 380 mm. This allows the TAB tape 100 of 82 m to be wound on the reel 310 which has a size of Φ 405 mm.

Then, the shipping label 315 is provided on the reel 310 on which the TAB tape 100 and the embossed tape 200 have been wound together (see (a) of FIG. 13).

Next, the reel 310 on which the TAB tape 100 and the embossed tape 200 have been wound together is contained in the antistatic bag 320 (see (a) and (b) of FIG. 13). After the reel 310 is contained in the antistatic bag 320, the antistatic bag 320 is evacuated and is then filled with nitrogen. An inlet of the antistatic bag 320 is subjected to thermocompression so that the reel 310 is sealed (see (c) of FIG. 13). Thereafter, a shipping label 325 is provided on the antistatic bag 320 in which the reel 310 is sealed (see (c) of FIG. 13).

Subsequently, the antistatic bag 320 in which the reel 310 is sealed is contained in the interior packaging case 330 (see (c) and (d) of FIG. 13). After a lid of the interior packaging case 330 is closed, the shipping label 335 is provided on the interior packaging case 330. Note that the interior packaging case 330 is to be contained in the exterior packaging case 340 in a subsequent process and it is therefore desirable to provide the shipping label 335 so that the shipping label 335 is easily visible when the interior packaging case 330 is contained in the exterior packaging case 340.

Then, four interior packaging cases 330 are contained in the exterior packaging case 340 (see (a) and (b) of FIG. 14). After the exterior packaging case 340 is end-sealed with a packaging tape or the like, a shipping label 345 which specifies information on what is interiorly packaged is provided on the exterior packaging case 340 (see (b) of FIG. 14).

As described earlier, the TAB tape 100 is packaged and then shipped and transported in the state illustrated in (b) of FIG. 14.

Conventionally, it has been considered as general that a TAB tape of approximately 40 m is wound on a small-sized reel which has a size of Φ 405 mm. Therefore, it has been impossible to wind the TAB tape of approximately 80 m on such a small-sized reel which has a size of Φ 405 mm, while sufficiently securing protection of the TAB tape during shipping and transportation.

In contrast, according to a packaging structure of the present embodiment, it is possible to wind the TAB tape 100 of 82 m on the reel 310 which has a size of Φ 405 mm. Namely, according to the packaging structure of the present embodiment, a total thickness of the embossed tape 200 is specified in accordance with a thickness of the semiconductor chip 103 and a thickness of the film 201 so that the protection of the TAB tape 100 is sufficiently secured while during shipping and transportation. Namely, in a case where the semiconductor chips 103 has the thickness t of "200 μm≦t≦625 μm" and the film 201 has a thickness of 0.125 mm, the embossed tape 200 is set to have a total thickness of "not less than (t+0.4) mm and not more than 1.1 mm". In addition, as a result of experiments, inventors of the present invention confirmed that even an embossed tape 200 which has embossed parts 202 only on its single surface has no problem with its packaging structure during shipping and transportation.

Note that it is obviously possible to wind the TAB tape 100 having a longer length not only on the reel 310 which has a size of Φ 405 mm but also on a reel 310 which has another size. According to the packaging structure of the present embodiment, it is possible to cause the TAB tape 100 to be approximately two times longer in the case of a reel which has a size of Φ 405 mm. For example, according to the packaging structure of the present embodiment, it is possible to wind the TAB tape 100 of 50 m to 100 m on the reel 310 which has a size of Φ350 mm to 420 mm. According to the packaging structure of the present embodiment, in the case of a reel which has a size of Φ 530 mm, it is possible to wind the TAB tape 100 having a maximum length of approximately 160 m, whereas it has been conventionally possible to wind the TAB tape 100 having a maximum length of approximately 80 m.

Note that there has been a problem that a larger reel causes no improvement in productivity. However, according to the packaging structure of the present embodiment, it is unnecessary to make the reel 310 larger while allowing the TAB tape 100 to be approximately two times longer. This allows use of a reel which is identical to that used before the TAB tape is caused to be longer. Therefore, as for the subsidiary materials such as the reel 310, the antistatic bag 320, the interior packaging case 330, and the exterior packaging case 340, it is possible to use existing conventional materials which have been used before the TAB tape is caused to be longer. This can prevent an increase in cost because it is unnecessary to newly prepare the subsidiary materials.

Note also that according to the packing structure of the present embodiment, it is possible to halve an area of a space which has been conventionally necessary to store an external packaging case. In other words, it is possible to store, in the space where the external packaging case has been stored, the TAB tape 100 which is approximately two times longer. This allows an improvement in productivity per floor area. Note that it is also possible to reduce, by 4 kg per shipping, a weight of a packaging structure at the time of shipping from 17 kg to 13 kg. This can also reduce shipping operations. In addition, it is possible to reduce costs of shipping and transportation.

Note that while the TAB tape 100 and the embossed tape 200 are being wound, the semiconductor rear surface B of the TAB tape 100 and the embossing rear surface D of the embossed tape 200 being in as large a surface-contact as possible by applying a tension to the respective tapes in their respective longitudinal directions. This prevents the TAB tape 100 and the embossed tape 200 from rubbing together, and dusting is therefore less likely to occur. Even if dusting occurs and then a dust is adhered to the TAB tape 100, then no defect caused by leak occurs because the embossed tape 200 is made of a specific material which has an effect of eliminating static electricity and a large resistance.

Note that, according to the packaging structure of the present embodiment, it is preferable to set (i) a coefficient of friction (in conformity with ASTMD1894) between the semiconductor rear surface B of the TAB tape 100 and the embossing rear surface D of the embossed tape 200 to fall within a range of 0.3 to 0.5 and (ii) a coefficient of friction (in conformity with ASTMD1894) between the semiconductor front surface A of the TAB tape 100 and a surface of the embossed tape 200 on which surface the embossed parts 202 are provided to not more than 0.3. This can prevent winding displacement of the tapes 100 and 200 from occurring between the semiconductor rear surface B of the TAB tape 100 and the embossing rear surface D of the embossed tape 200 due to a vibration caused during transportation. In addition, the semiconductor front surface A of the TAB tape 100 and the surface of the embossed tape 200 on which surface the embossed parts 202 are provided are slippery, and it is therefore possible to prevent the TAB tape 100 and the embossed tape 200 from waving in a state where the TAB tape 100 and the embossed tape 200 have been wound on the reel 310.

Note that the coefficient of friction refers to a coefficient of static friction. According to measurement of the coefficient of static friction by a friction coefficient measuring method in conformity with ASTMD1894, the coefficient of static friction was 0.3 to 0.5 between (a) the embossing rear surface D of the single-sided embossed tape 200 which is made of polyethylene terephthalate and (b) the semiconductor rear surface B of the TAB tape 100 which is made of polyimide. On the other hand, the measurement demonstrated that the coefficient of static friction was 0.2 to 0.001 between (a) the surface of the embossed parts 202 of the embossed tape 200 and (b) the semiconductor front surface A of the TAB tape 100. For comparison, the coefficient of static friction was also measured in the case of an embossed tape (a double-sided embossed tape) having embossed parts on its both sides. According to the measurement, the coefficient of static friction was 0.2 to 0.001 between (i) the respective surfaces of the embossed tape and (ii) the TAB tape 100.

In the case of the double-sided embossed tape, each of the both surfaces has a small coefficient of friction. This causes winding displacement between the double-sided embossed tape and the TAB tape to easily occur due to a vibration caused during transportation. In contrast, in the case of the single-sided embossed tape 200, one of the surfaces has a larger coefficient of friction than the other. This causes the single-sided embossed tape 200 to have a property of being resistant to tape displacement. Note that the single-sided embossed tape 200 has an advantage of being less likely to be charged. This is because the single-sided embossed tape 200 has an electroconductive part which is in contact with the surface of the TAB tape 100 which surface is made of polyimide.

Note that in a case where the semiconductor chips 103 are provided at a pitch of 19 mm (4 pitches, 1 pitch: 4.75 mm) on the TAB tape 100 of 40 m, one (1) reel 310 which has a size of Φ 405 mm has roughly a maximum of 2100 semiconductor chips 103. Note also that in a case where a TAB tape 100 has a yield of 90%, one (1) reel 310 has approximately 1900 semiconductor chips 103.

This causes the exterior packaging case 340, in which a plurality of the interior packaging cases 330 in each of which the reel 310 on which the TAB tape 100 and the embossed tape 200 have been wound and the antistatic bag 320 are contained, to weigh 1.7 kg to 2.5 kg.

EXAMPLES

Example 1

It was tested how long the TAB tape 100 (a thickness of the film 101: 0.04 mm, a thickness of the semiconductor chip 103: 0.625 mm) (see FIG. 1) can be wound, in accordance with a total thickness of the embossed tape 200 (a thickness of the film 201: 0.125 mm) (see FIG. 2), on the reel 310 which has a size of Φ 405 mm.

Figure 15:
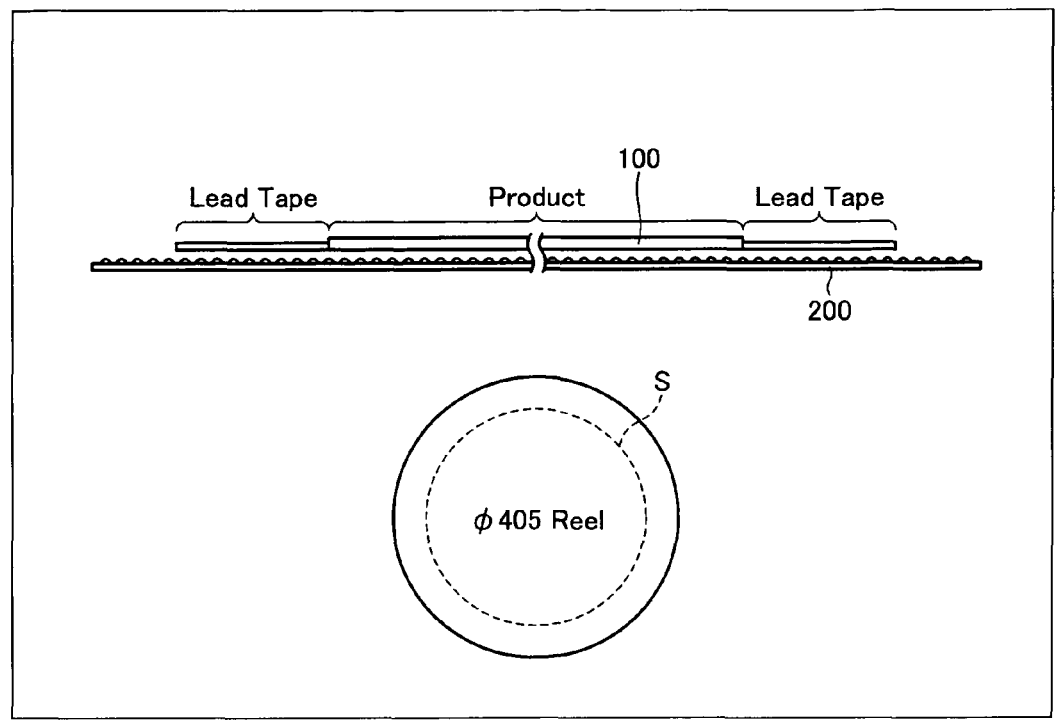
FIG. 15 is a schematic view for illustrating winding of the TAB tape including a lead tape.

Note that, according to the TAB tape 100, a lead tape is actually provided at each of a front end part and a back end part of the TAB tape 100 so that workability is improved in a production process. FIG. 15 illustrates the TAB tape 100 which has the lead tapes at its front end part and back end part. The lead tape, provided at the front end part of the TAB tape 100, is caused to, for example, pass through a slit provided on the core section 311 of the reel 310. The lead tape is thus used to cause the TAB tape 100 to be fixed at the start of winding of the TAB tape 100. The lead tape, provided at the back end part of the TAB tape 100 is extended to a tape unwinding section and a tape processing section. The lead tape is thus used to stably keep a state where the TAB tape 100 has been wound.

Note that such lead tapes have an industry standard length of 6 m (3 m for the front end part and 3 m for the back end part). Accordingly, in the present Example, the test was carried out by use of the lead tape which has a length of 6 m. The test was also carried out by use of lead tapes which have respective lengths of 8 m and 4 m, in view of the fact that a lead tape which has a length around 6 m is sometimes used in accordance with various designs.

Note that, in a case where the reel 310 which has a size of Φ 405 mm is used, a suitable winding circumference S of a product has a maximum length of Φ 380 mm in view of workability in a process. According to this, a winding length of the TAB tape 100 was measured in a case where the TAB tape 100 having the lead tape and the embossed tape 200 were caused to overlap each other (see FIG. 15) and the winding circumference S was set to Φ 380 mm. In this case, the measurement was carried out while a winding tension within a range of 50 gf to 200 gf is being applied to the TAB tape 100 so that the TAB tape 100 is stably wound on the reel 310.

FIG. 17 shows result data.

Figure 16:
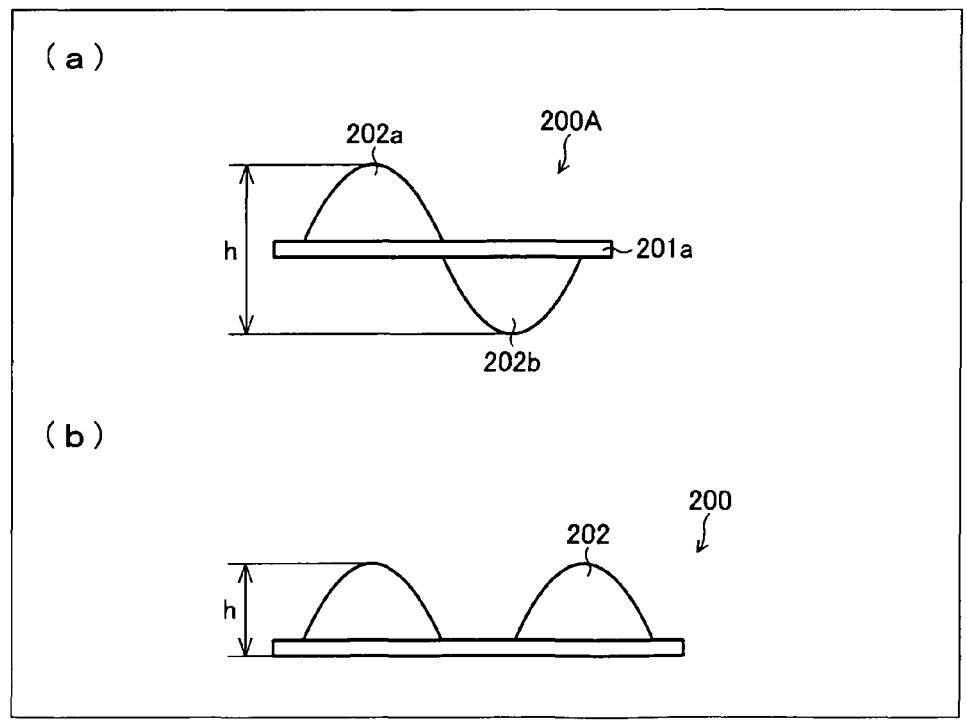
FIG. 16 is a side view illustrating the embossed tape. (a) of FIG. 16 illustrates an example of the double-sided embossed tape, and (b) of FIG. 16 illustrates an example of the single-sided embossed tape.

"Double-sided embossed" tape in FIG. 17 shows a measured result obtained in a case of winding, on the reel 310, (i) an embossed tape 200A which has embossed parts 202a provided on one surface of the embossed tape 200A (a thickness of a film 201a: 0.125 mm, a total thickness h: 2.275 mm) and embossed parts 202b provided on the other surface, (see (a) of FIG. 16) and (ii) the TAB tape 100. According to the embossed tape 200A, in a case where the lead tapes have respective lengths of 8 m, 6 m, and 4 m, it was possible to wind, on the reel 310, the TAB tapes 100 having respective lengths of 36 m, 38 m, and 40 m. This reproduces conventional winding lengths.

"Single-sided embossed" tape in FIG. 17 shows a measured result obtained in a case of winding, on the reel 310, (i) the embossed tape 200 which has the embossed parts 202 (see (b) of FIG. 16) and (ii) the TAB tape 100. According to the embossed tape 200 which has the total length h of 1.2 mm, in a case where the lead tapes have respective lengths of 8 m, 6 m, and 4 m, it was possible to wind, on the reel 310, the TAB tapes 100 having respective lengths of 73 m, 75 m, and 77 m. According to the embossed tape 200 which has the total length of 1.1 mm, in a case where the lead tapes have respective lengths of 8 m, 6 m, and 4 m, it was possible to wind, on the reel 310, the TAB tapes 100 having respective lengths of 80 m, 82 m, and 84 m. Accordingly, the measured results show that it is possible to wind, on the reel 310, the TAB tape 100 having a length of not less than 80 m, in a case where the embossed tape 200 has the total length h of not more than 1.1 m.

Note that, in order to check a limit length of the TAB tape 100, data were also measured and checked, under a condition under which the result data (see FIG. 17) were measured, in a case where the winding circumference S of the reel 310 was changed from Φ 380 mm to Φ 385 mm.

FIG. 18 shows result data. According to the embossed tape 200A, in a case where the lead tapes have respective lengths of 8 m, 6 m, and 4 m, it was possible to wind, on the reel 310, the TAB tapes 100 having respective lengths of 37 m, 39 m, and 41 m.

In contrast, according to the embossed tape 200 which has the total length of 1.2 mm, in a case where the lead tapes have respective lengths of 8 m, 6 m, and 4 m, it was possible to wind, on the reel 310, the TAB tapes 100 having respective lengths of 75 m, 77 m, and 79 m. According to the embossed tape 200 which has the total length of 1.1 mm, in a case where the lead tapes have respective lengths of 8 m, 6 m, and 4 m, it was possible to wind, on the reel 310, the TAB tapes 100 having respective lengths of 82 m, 84 m, and 86 m. Accordingly, the measured results show that it is possible to wind, on the reel 310, the TAB tape 100 having not less than 80 m in a case where the embossed tape 200 has the total length h of not more than 1.1 m.

Example 2

Figure 19:
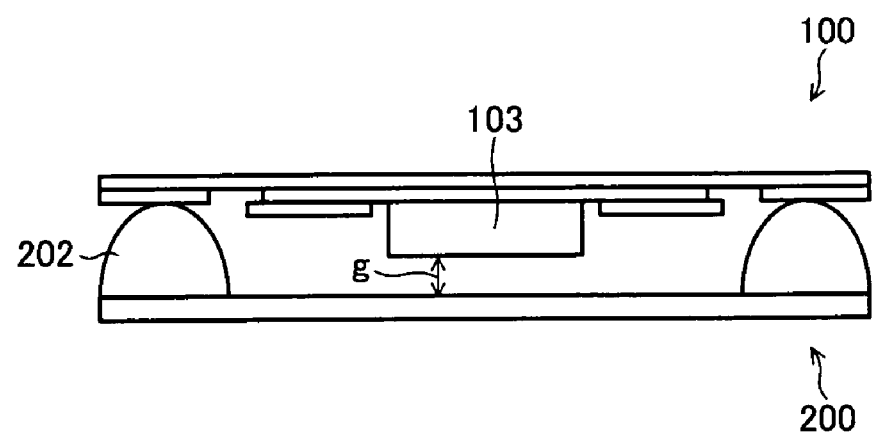
FIG. 19 is a cross-sectional view illustrating a gap between a semiconductor chip and the embossed tape.

In a case where the TAB tape 100 and the embossed tape 200 are wound while overlapping each other, a gap g is secured between the semiconductor chip 103 and the embossed tape 200 (see FIG. 19). However, a warp(s) in the TAB tape 100 and/or in the embossed tape 200 may cause the embossed tape 200 to be rubbed due to a contact between the semiconductor chip 103 and the embossed tape 200.

Figure 21:
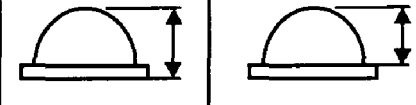
FIG. 21 is a chart showing a distance of the gap between the semiconductor chip and the embossed tape in a combination of a thickness of the semiconductor chip and a total thickness of the embossed tape.

In view of the circumstances, it was checked, in accordance with the gap between the semiconductor chip 103 and the embossed tape 200, whether or not the embossed tape 200 was rubbed. FIG. 21 shows a distance of the gap which varies depending on a combination of (i) a total thickness and a real height of the embossed tape 200 and (ii) a thickness of the semiconductor chip 103. The semiconductor chips 103 which have respective thicknesses of 0.4 mm, 0.625 mm, and 0.725 mm were used. The embossed tapes 200 which have respective total thicknesses of 0.8 mm to 1.2 mm in increments of 0.1 mm were used. Note that a total thickness of 20 μm of (i) a height of the bump of the semiconductor chip 103 and (ii) a thickness of the wiring pattern 102 (8 μm) was taken into consideration.

For example, in a case where the semiconductor chip 103 has a thickness of 0.4 mm and the embossed tape 200 has a real height of 0.675 mm (a total thickness of 0.8 mm), the gap g between the semiconductor chip 103 and the embossed tape 200 is 0.263 mm.

Figure 22:
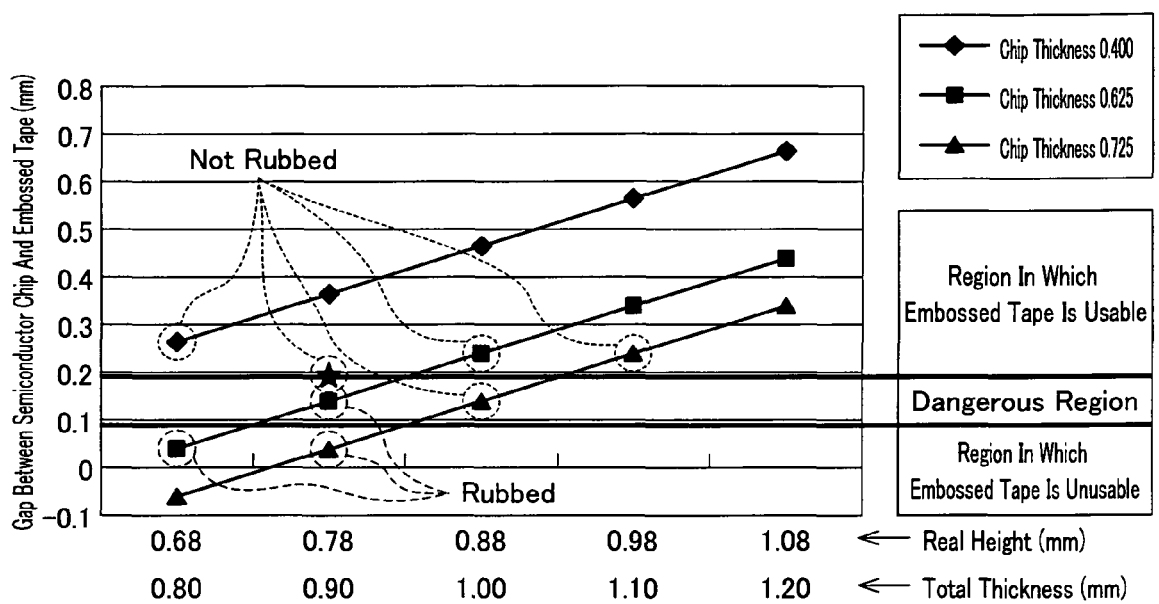
FIG. 22 is a graph illustrating, in accordance with a gap between the semiconductor chip and the embossed tape, whether or not there is damage to the embossed tape.
Figure 23:
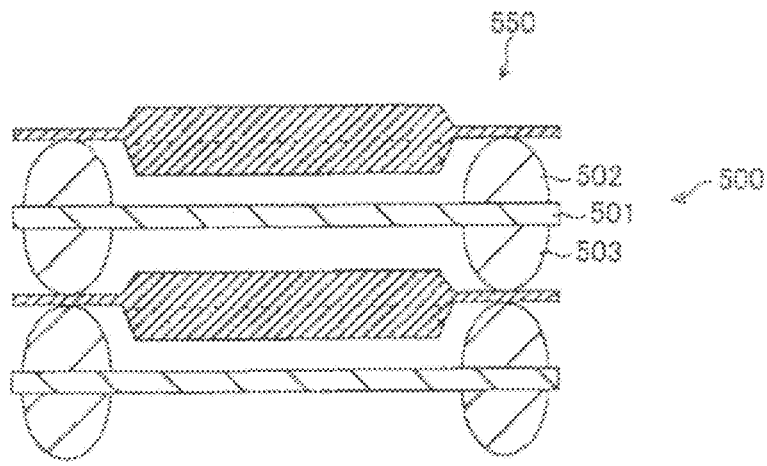
FIG. 23 is a cross-sectional view illustrating a state where a TAB tape has been wound on a reel by use of a conventional spacer tape.
Figure 24:
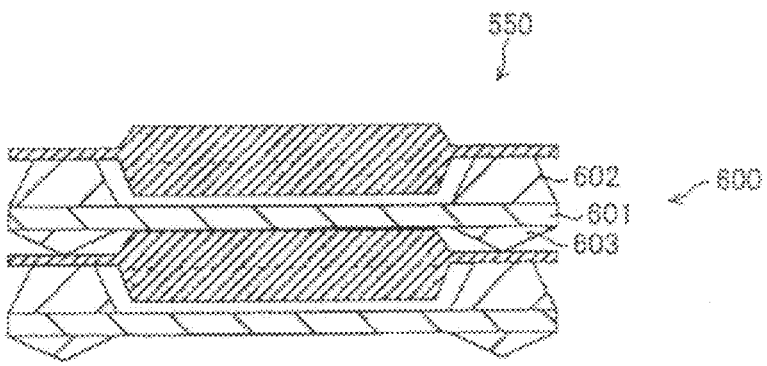
FIG. 24 is a cross-sectional view illustrating a state where the TAB tape has been wound on the reel by use of another conventional spacer tape.
Figure 25:
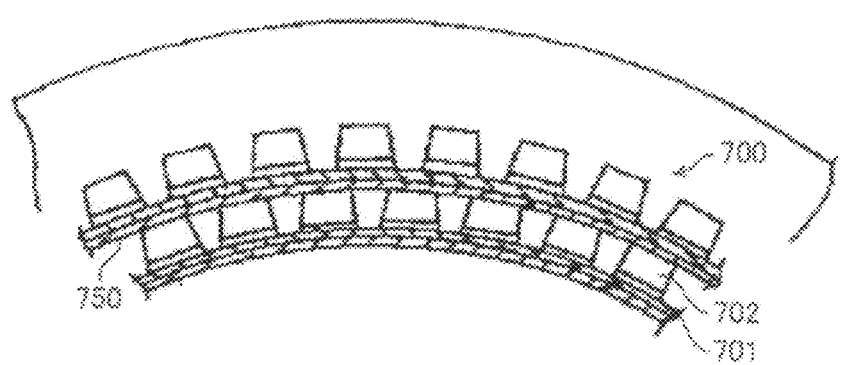
FIG. 25 is a cross-sectional view illustrating a state where the TAB tape has been wound on the reel by use of a further conventional spacer tape.

Then, samples of the respective combinations (see FIG. 21) were prepared, and it was checked whether or not the embossed tape 200 was actually rubbed. FIG. 22 shows a result of this. Even in a case where the semiconductor chip 103 has a thickness of 0.4 mm, the embossed tape 200, which has a real height of 0.675 mm (a total thickness of 0.8 mm), was not rubbed (see FIG. 22).

Note that, in a case where the semiconductor chip 103 has a thickness of 0.625 mm, the embossed tape 200, which has a real height of 0.875 mm (a total thickness of 1.0 mm), was not rubbed, whereas the embossed tape 200, which has a real height of 0.775 mm (a total thickness of 0.9 mm), was rubbed. Note also that, in a case where the semiconductor chip 103 has a thickness of 0.725 mm, the embossed tape 200, which has a real height of 0.875 mm (a total thickness of 1.0 mm), was not rubbed, whereas the embossed tape 200, which has a real height of 0.775 mm (a total thickness of 0.9 mm), was rubbed.

The result described above shows that there are (i) a region in which an embossed tape is usable, with no fear, as a product, (ii) a dangerous region in which attention should be paid when the embossed tape is used as a product, and (iii) a region in which the embossed tape is unusable as a product.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is suitably usable in a packaging structure in which (i) a TAB tape on which semiconductor devices are sequentially provided and (ii) an embossed tape are wound while overlapping each other on a reel and then packaged. The present invention is also extensively usable in a field related to a method for packaging the TAB tape and a field related to production of members used in the packaging structure.

The invention claimed is:

1. A semiconductor apparatus packaging structure, comprising:
a semiconductor apparatus having a plurality of semiconductor chips fixed on a tape-like insulating film on which wiring patterns are repeatedly provided, so as to be electrically connected to the respective wiring patterns;
an embossed tape which is electroconductive and has protruding parts which are sequentially provided on a first surface of and in a longitudinal direction of a tape-like electroconductive film; and
a reel which is electroconductive, wherein
the semiconductor apparatus and the embossed tape are wound on the reel,
the tape-like insulating film has a first surface on which surface the plurality of semiconductor chips are fixed,
the first surface of the tape-like electroconductive film from which surface the protruding parts protrude, and the first surface of the tape-like insulating film overlap and face each other,
the embossed tape has a total thickness of not less than (t+0.4) mm and not more than 1.1 mm in a case where each of the plurality of semiconductor chips has a thickness of t ($0.2 \leq t \leq 0.625$) mm and the tape-like electroconductive film has a substantial thickness of 0.125 mm,
the total thickness of the embossed tape is obtained by adding the substantial thickness of the tape-like electroconductive film and a thickness of the protruding parts,
the semiconductor apparatus is not in contact with the embossed tape,
a coefficient of friction between (i) a second surface of the tape-like insulating film, which surface is opposite to the first surface of the tape-like insulating film, and (ii) a second surface of the tape-like electroconductive film, which surface is opposite to the first surface of the tape-like electroconductive film, is set to not less than 0.3 and not more than 0.5, and
a coefficient of friction between (i) the first surface of the tape-like insulating film and (ii) the first surface of the tape-like electroconductive film is set to not more than 0.3.

2. The semiconductor apparatus packaging structure as set forth in claim 1, wherein not less than 80 percent in area of a second surface of the tape-like insulating film, which surface is opposite to the first surface of the tape-like insulating film, and a second surface of the tape-like electroconductive film, which surface is opposite to the first surface of the tape-like electroconductive film, are in surface-contact.

3. The semiconductor apparatus packaging structure as set forth in claim 1, wherein the embossed tape has a surface resistance of not less than $10^6 \Omega$ and not more than $10^9 \Omega$.

4. The semiconductor apparatus packaging structure as set forth in claim 1, wherein the embossed tape is made of polyethylene terephthalate resin, polyethylene naphthalate resin, polyimide resin, polyetherimide resin, polysulphone resin, polyethylene resin, polypropylene resin, polyamide resin, or polyether sulfine resin.

5. The semiconductor apparatus packaging structure as set forth in claim 1, wherein the number of the protruding parts is not less than 1.5 and not more than 3, per 20 mm in a longitudinal direction of the embossed tape.

6. The semiconductor apparatus packaging structure as set forth in claim 1, further comprising:
an antistatic or a dampproof bag in which the reel on which the semiconductor apparatus and the embossed tape have been wound is contained; and
a second box in which a plurality of first boxes are contained and which has a larger size than each of the first boxes, in each of the first boxes the antistatic or dampproof bag being contained.

7. A semiconductor apparatus packaging method in which (i) a semiconductor apparatus including a plurality of semiconductor chips which are fixed, on a tape-like insulating film on which wiring patterns are repeatedly provided, so as to be electrically connected to the respective wiring patterns and (ii) an embossed tape which is electroconductive and has protruding parts which are sequentially provided on a first surface of and in a longitudinal direction of a tape-like electroconductive film are wound on a reel which is electroconductive,
said method comprising the steps of:
winding the semiconductor apparatus and the embossed tape on the reel, while causing (i) a first surface of the tape-like insulating film on which surface the plurality of semiconductor chips are fixed and (ii) the first surface of the tape-like electroconductive film from which surface the protruding parts protrude to overlap and face each other, and
using the embossed tape which has a total thickness of not less than (t+0.4) mm and not more than 1.1 mm in a case where each of the plurality of semiconductor chips has a thickness of t ($0.2 \leq t \leq 0.625$) mm and the tape-like electroconductive film has a substantial thickness of 0.125 mm, wherein
the total thickness of the embossed tape is obtained by adding the substantial thickness of the tape-like electroconductive film and a thickness of the protruding parts,
the semiconductor apparatus is not in contact with the embossed tape,
a coefficient of friction between (i) a second surface of the tape-like insulating film, which surface is opposite to the first surface of the tape-like insulating film, and (ii) a second surface of the tape-like electroconductive film, which surface is opposite to the first surface of the tape-like electroconductive film, is set to not less than 0.3 and not more than 0.5, and
a coefficient of friction between (i) the first surface of the tape-like insulating film, and (ii) the first surface of the tape-like electroconductive film is set to not more than 0.3.

8. The semiconductor apparatus packaging method as set forth in claim 7, wherein the semiconductor apparatus and the embossed tape are wound on the reel while a tension of not less than 10 gf and not more than 200 gf is being applied to the semiconductor apparatus and the embossed tape so that not less than 80 percent in area of (i) a second surface of the tape-like insulating film which surface is opposite to the first surface of the tape-like insulating film and (ii) a second surface of the tape-like electroconductive film which surface is opposite to the first surface of the tape-like electroconductive film are in surface-contact.

9. The semiconductor apparatus packaging method as set forth in claim 7, further comprising the steps of:
preparing a plurality of reels, a plurality of antistatic or dampproof bags, and a plurality of first boxes;

causing each of the plurality of reels on which the semiconductor apparatus and the embossed tape have been wound to be contained in each of the plurality of antistatic or dampproof bags;
causing each of the plurality of antistatic or dampproof bags to be contained in each of the first boxes; and causing the plurality of first boxes to be contained in a second box which has a larger size than each of the plurality of first boxes.

* * * * *